(12) United States Patent
Bodan et al.

(10) Patent No.: US 9,281,424 B2
(45) Date of Patent: Mar. 8, 2016

(54) WIDEBAND LIGHT ENERGY WAVEGUIDE AND DETECTOR

(71) Applicant: AMI Research & Development, LLC, Windham, NH (US)

(72) Inventors: Patricia Bodan, Amherst, NH (US); John T. Apostolos, Lyndeborough, NH (US); Benjamin McMahon, Nottingham, NH (US); William Mouyos, Windham, NH (US)

(73) Assignee: AMI Research & Development, LLC, Windham, NH (US)

(*) Notice: Subject to any disclaimer, the term of this patent is extended or adjusted under 35 U.S.C. 154(b) by 0 days.

(21) Appl. No.: 14/078,755

(22) Filed: Nov. 13, 2013

(65) Prior Publication Data

US 2014/0182656 A1 Jul. 3, 2014

Related U.S. Application Data

(60) Provisional application No. 61/725,732, filed on Nov. 13, 2012, provisional application No. 61/756,524, filed on Jan. 25, 2013, provisional application No. 61/782,992, filed on Mar. 14, 2013, provisional application No. 61/900,434, filed on Nov. 6, 2013.

(51) Int. Cl.
*H01L 31/054* (2014.01)
*H02S 40/22* (2014.01)
*H01L 31/0232* (2014.01)
(Continued)

(52) U.S. Cl.
CPC ...... *H01L 31/02327* (2013.01); *H01L 31/0525* (2013.01); *H01L 31/0543* (2014.12); *H01L 31/0547* (2014.12); *H01L 31/0549* (2014.12); *H01L 31/1085* (2013.01); *H02S 40/22* (2014.12); *Y02E 10/52* (2013.01)

(58) Field of Classification Search
CPC .................................................... H01L 31/0528
See application file for complete search history.

(56) References Cited

U.S. PATENT DOCUMENTS

| | | |
|---|---|---|
| 3,864,111 A | 2/1975 | Kemp |
| 3,883,221 A | 5/1975 | Rigrod |
| 3,898,585 A | 8/1975 | Heidrich et al. |

(Continued)

FOREIGN PATENT DOCUMENTS

| | | |
|---|---|---|
| EP | 2 348 342 | 7/2011 |
| GB | 2456660 | 7/2009 |

(Continued)

OTHER PUBLICATIONS

Definition of dichroism [retrieved from http://www.merriam-webster.com/dictionary/dichroism on Jun. 24, 2015].*

(Continued)

*Primary Examiner* — Jeffrey T Barton
*Assistant Examiner* — Eric R Smith
(74) *Attorney, Agent, or Firm* — Cesari and McKenna, LLP

(57) ABSTRACT

An electromagnetic energy concentrator uses a prism and waveguide with a gap layer of uniform thickness disposed between the prism and a first surface of waveguide. Energy detectors, which may be photovoltaics or miniaturized antenna elements are disposed adjacent to and co-extensive with a second surface of the waveguide. The detectors operate in each of at least two bands; a distance between detectors operating in a given band depends on a wavelength in the given band.

8 Claims, 23 Drawing Sheets

(51) Int. Cl.
*H01L 31/052* (2014.01)
*H01L 31/108* (2006.01)

(56) References Cited

U.S. PATENT DOCUMENTS

| | | | |
|---|---|---|---|
| 4,116,718 A | 9/1978 | Yerkes et al. | |
| 4,357,486 A | 11/1982 | Blieden et al. | |
| 4,445,050 A | 4/1984 | Marks | |
| 4,574,161 A | 3/1986 | Marks | |
| 4,932,743 A | 6/1990 | Isobe et al. | |
| 4,992,306 A | 2/1991 | Hochberg | |
| 5,090,017 A | 2/1992 | Mendenhall et al. | |
| 5,144,498 A | 9/1992 | Vincent | |
| 5,177,352 A | 1/1993 | Carson | |
| 5,235,589 A | 8/1993 | Yokomori | |
| 5,315,676 A | 5/1994 | Sunagawa | |
| 5,390,046 A | 2/1995 | Gesell et al. | |
| 5,420,947 A | 5/1995 | Li | |
| 5,466,617 A | 11/1995 | Shannon | |
| 5,637,358 A | 6/1997 | Otoshi | |
| 5,652,816 A | 7/1997 | Minami | |
| 5,726,662 A | 3/1998 | Hopwood | |
| 5,781,676 A | 7/1998 | Okada | |
| 5,784,507 A | 7/1998 | Holm-Kennedy | |
| 5,877,874 A | 3/1999 | Rosenberg | |
| 6,016,122 A | 1/2000 | Malone et al. | |
| 6,200,712 B1 | 3/2001 | Fan | |
| 6,271,526 B1 | 8/2001 | Cwik | |
| 6,281,766 B1 | 8/2001 | Malone et al. | |
| 6,434,303 B1 | 8/2002 | Temkin | |
| 6,501,093 B1 | 12/2002 | Marks | |
| 6,730,389 B2 | 5/2004 | Voeltzel | |
| 6,847,155 B2 | 1/2005 | Schwartz et al. | |
| 6,898,352 B2 | 5/2005 | Deliwala | |
| 6,993,236 B1 | 1/2006 | Gunn, III | |
| 7,071,888 B2 | 7/2006 | Sievenpiper | |
| 7,095,928 B2 | 8/2006 | Blauvelt et al. | |
| 7,157,989 B2 | 1/2007 | Kim | |
| 7,190,326 B2 | 3/2007 | Voeltzel | |
| 7,408,507 B1 | 8/2008 | Paek et al. | |
| 7,456,803 B1 | 11/2008 | Sievenpiper | |
| 7,949,210 B2 | 5/2011 | Durfee | |
| 7,972,522 B2 | 7/2011 | Jordana et al. | |
| 8,115,683 B1* | 2/2012 | Stefanakos et al. | 343/700 MS |
| 8,160,404 B2 | 4/2012 | Pan | |
| 2002/0029748 A1 | 3/2002 | Kuwada | |
| 2002/0171078 A1 | 11/2002 | Eliasson et al. | |
| 2003/0063204 A1 | 4/2003 | Sudo | |
| 2003/0118306 A1 | 6/2003 | Deliwala | |
| 2004/0008943 A1 | 1/2004 | Berini | |
| 2004/0022050 A1 | 2/2004 | Yamashita et al. | |
| 2004/0045932 A1 | 3/2004 | Kochergin et al. | |
| 2004/0104346 A1* | 6/2004 | Devitt et al. | 250/339.14 |
| 2004/0208589 A1 | 10/2004 | Hobbs | |
| 2005/0008294 A1 | 1/2005 | Park | |
| 2005/0051205 A1 | 3/2005 | Mook | |
| 2005/0175286 A1 | 8/2005 | Patel | |
| 2007/0137690 A1* | 6/2007 | Bruning et al. | 136/246 |
| 2007/0137691 A1* | 6/2007 | Cobb et al. | 136/246 |
| 2007/0147767 A1 | 6/2007 | Nonaka | |
| 2007/0240757 A1 | 10/2007 | Ren et al. | |
| 2007/0275558 A1 | 11/2007 | Ushijima | |
| 2008/0158676 A1 | 7/2008 | Sugino | |
| 2008/0186508 A1 | 8/2008 | Kiesel et al. | |
| 2008/0187011 A1 | 8/2008 | Kiesel et al. | |
| 2009/0066597 A1 | 3/2009 | Yang et al. | |
| 2009/0245725 A1 | 10/2009 | Yonekura | |
| 2009/0320913 A1 | 12/2009 | Smith | |
| 2010/0001917 A1 | 1/2010 | Manasson et al. | |
| 2010/0091293 A1 | 4/2010 | Shani | |
| 2010/0108133 A1 | 5/2010 | Bhagavatula | |
| 2010/0139749 A1 | 6/2010 | Mapel | |
| 2010/0139769 A1 | 6/2010 | Mapel | |
| 2010/0200044 A1 | 8/2010 | Zaban et al. | |
| 2010/0212717 A1 | 8/2010 | Whitlock et al. | |
| 2010/0288352 A1 | 11/2010 | Ji et al. | |
| 2010/0322558 A1 | 12/2010 | Ogawa | |
| 2011/0023941 A1 | 2/2011 | Didomenico | |
| 2011/0030757 A1 | 2/2011 | Lin et al. | |
| 2011/0042555 A1 | 2/2011 | Bathe | |
| 2011/0216315 A1 | 9/2011 | Uematsu | |
| 2011/0220172 A1 | 9/2011 | Layton | |
| 2011/0232211 A1 | 9/2011 | Farahi | |
| 2011/0253198 A1 | 10/2011 | Patrick | |
| 2011/0255824 A1 | 10/2011 | Lee et al. | |
| 2012/0204937 A1 | 8/2012 | Apostolos et al. | |
| 2012/0204954 A1 | 8/2012 | Apostolos | |
| 2012/0204955 A1 | 8/2012 | Apostolos | |
| 2012/0204956 A1 | 8/2012 | Apostolos | |
| 2012/0205525 A1 | 8/2012 | Apostolos | |
| 2012/0206726 A1* | 8/2012 | Pervez et al. | 356/402 |
| 2012/0206807 A1 | 8/2012 | Apostolos | |

FOREIGN PATENT DOCUMENTS

| | | |
|---|---|---|
| JP | 2000151933 A | 5/2000 |
| JP | 2007/218540 A | 8/2007 |
| JP | 2009/053458 A | 3/2009 |
| WO | WO 2007/138589 A2 | 12/2007 |
| WO | WO 2009/002943 A2 | 12/2008 |
| WO | WO 2009/064888 | 5/2009 |
| WO | WO 2010/023657 A2 | 3/2010 |
| WO | WO 2010/033859 A2 | 3/2010 |
| WO | WO 2011/119179 | 9/2011 |
| WO | WO 2012/066954 | 5/2012 |

OTHER PUBLICATIONS

Definition of adjacent [retrieved from http://www.merriam-webster.com/dictionary/adjacent on Jun. 24, 2015].*
International Search Report and Written Opinion mail date Feb. 17, 2014 for International Application No. PCT/US2013/069804, International Filing Date of Nov. 13, 2013 by AMI Research & Development, LLC, 11 pages.
Guenther, Robert, Modern Optics, John Wiley & Sons, 1990.
Transmittal of International Preliminary Report on Patentability mail date May 28, 2013 for International Application No. PCT/US12/24872, International Filing Date Feb. 13, 2012 by AMI Research & Development, LLC for High Performance, Low-Profile Antennas, 39 pages.
J. H. Karp and J.E. Ford, "Planar micro-optic solar concentration using multiple imaging lenses into a common slab waveguide", Proceedings of SPIE 7407, High and Low Concentrator Systems for Solar Electric Applications IV, 74070D, Aug. 20, 2009, 11 pages.
Mashaal & Gordon, "Rectenna harvesting of sunlight", Feb. 24, 2012.
Milonni et al. "Laser Physics" John Wiley & Sons 2010, pp. 331-400.
International Search Report and the Written Opinion, date of mailing Aug. 6, 2012 for International Application No. PCT/US2012/022717 for AMI Research & Development, LLC International Filing Date Jan. 26, 2012, 17 pages.
International Search Report and the Written Opinion, date of mailing Jun. 22, 2012 for International Application No. PCT/US2012/024872 for AMI Research & Development, LLC International Filing Date Feb. 13, 2012, 11 pages.
Stevenson, Richard, "Photovoltaics take a load off soldiers," Technology Solar Cells, Copyright Institute of Physics and IOP Publishing Ltd, 2006, 3 pages.
Vaccaro, S., et al. "Making Planar Antennas Out of Solar Cells" Electronic Letters, 38:17, Aug. 15, 2002.
Lin, C., et al. "Nano-Structured and Micro-Structured Semiconductors for Higher Efficiency Solar Cells"; IEEE Singapore, 4 pages, Dec. 8-11, 2008.
Tentzeris, M. "IMS2011 Abstract Card"; TU1C: RFID Technologies and Applications, Jun. 7, 2011.
Sarehraz, M., et al. "Rectenna Developments for Solar Energy Collection" IEEE, pp. 78-81; Aug. 8, 2005.
Grover, S., "Traveling-Wave Metal/Insulator/Metal Diodes for Improved Infrared Bandwidth and Efficiency of Antenna-Coupled Rectifiers" IEEE Transactions of Nanotechnology; 9:6, Nov. 2010.

(56) References Cited

OTHER PUBLICATIONS

Bozzetti, M., et al "Analysis and Design of a Solar Rectenna" IEEE, pp. 2001-2004; Nov. 10, 2010.

Baba, T. "Monolithic Integration of an ARROW-Type Demultiplexer and Photodetector in the Shorter Wavelength Region" Journal of Lightwave Technology 8:1; Jan. 1990.

Tangonan, G.L. et al. "Tapered gap prism couplers for high index materials" Applied Optics; 16:7 pp. 1795-1796; Jul. 1977.

Mendes, Sergio B., et al., "Achromatic prism-coupler for planar waveguide", Optics Communications 136(1997) pp. 320-326.

Dictionary of Scientific and Technical Terms, McGraw Hill, New York, 1974, p. 1603.

"Introduction to Modem Optics" 2nd Ed., G.R. Fowles, p. 294-297, Dover Publications, New York (1989).

H. Mashaal, et al. "First direct measurement of the spatial coherence of sunlight" Optics Letters 37(17), p. 3516-3518 (2012).

R.L. Diebner and J.G. Kay "Absorption spectrum of vaporized titanium monofluoride" The Journal of Chemical Physics 51(8), p. 3547-3554 (1969).

* cited by examiner

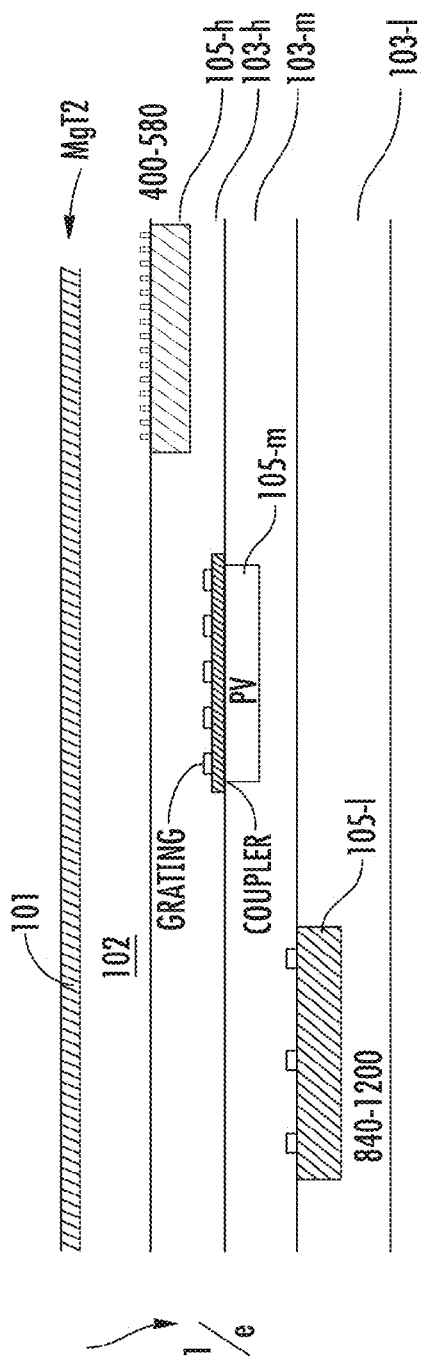
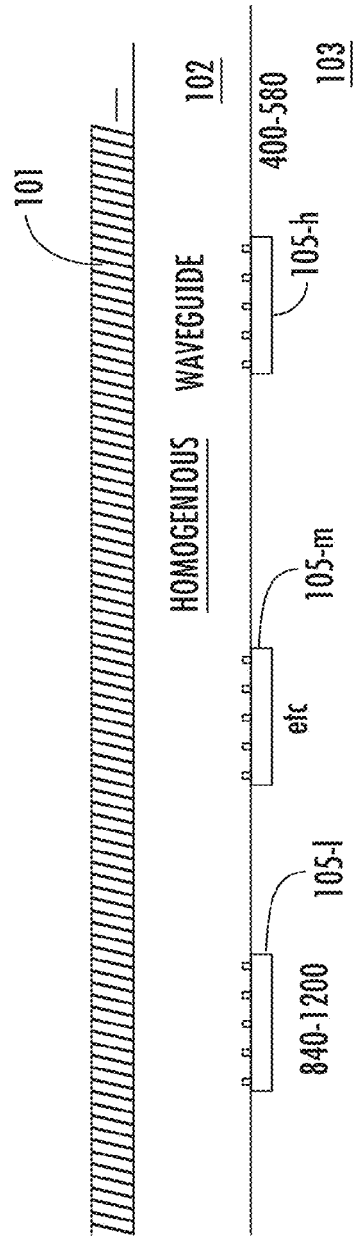
FIG. 3A
FIG. 3B

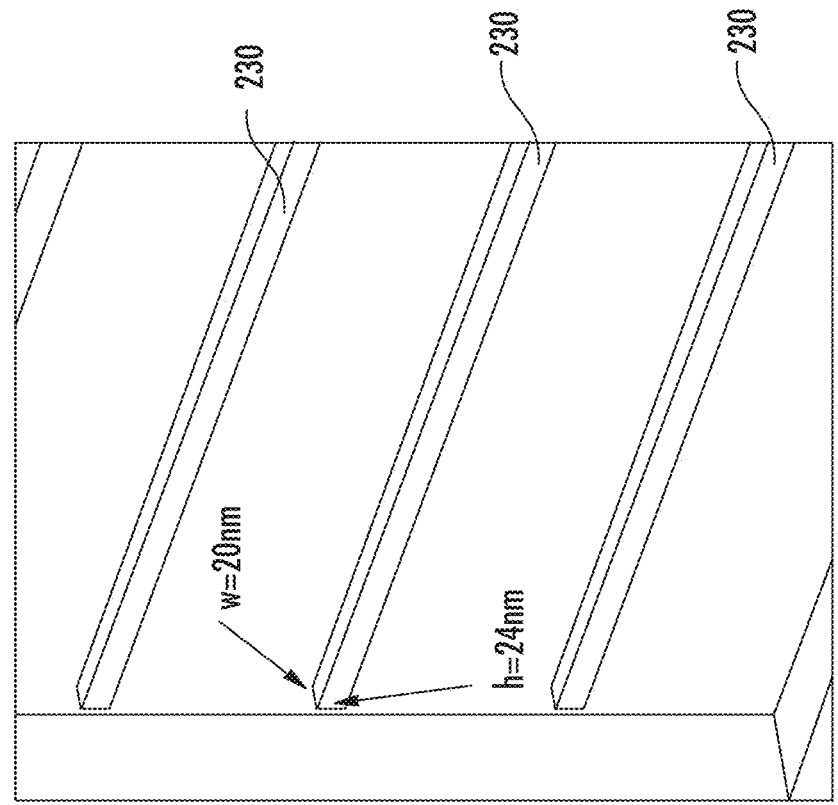
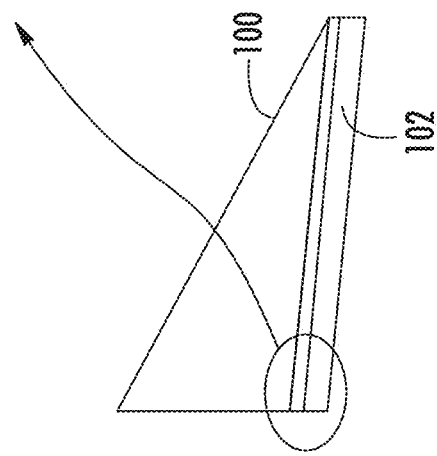
FIG. 4A

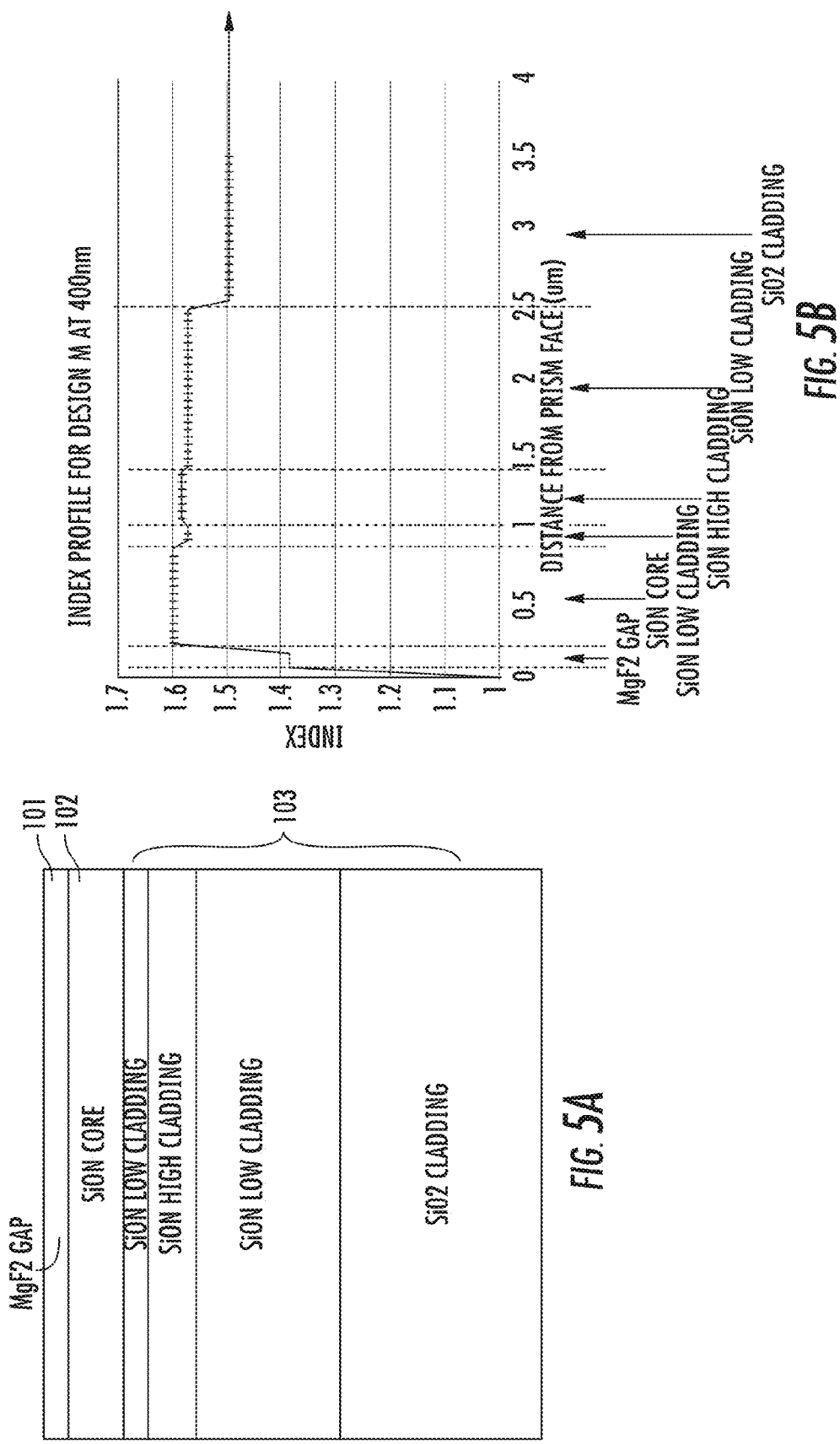

INTEGRATE BOWTIE ANTENNA AND METAL-INSULATOR-METAL Ni-NiO-Ni DIODE

WIDEBAND LIGHT ENERGY WAVEGUIDE AND DETECTOR

CROSS REFERENCE TO RELATED APPLICATIONS

This application claims the benefit of the filing date of the following and commonly assigned U.S. Patent Application Ser. No. 61/725,732, which was filed on Nov. 13, 2012, by Patricia Bodan et al. for a BASIC SOLAR CONCENTRATOR MODULE, commonly assigned U.S. Patent Application Ser. No. 61/756,524, which was filed on Jan. 25, 2013, by Patricia Bodan et al. for a WIDE SPECTRAL BANDWIDTH PRISM-COUPLED OPTICAL WAVEGUIDE WITH SPECTRAL FILTERING TO PHOTOVOLTAIC DEVICES, commonly assigned U.S. Patent Application Ser. No. 61/782,992, which was filed on Mar. 14, 2013, by Patricia Bodan et al. for a WIDE SPECTRAL BANDWIDTH PRISM-COUPLED OPTICAL WAVEGUIDE FOR PHOTOVOLTAIC DEVICES, and commonly assigned U.S. Patent Application Ser. No. 61/900,434, which was filed on Nov. 6, 2013, by Patricia Bodan et al. for a MONOLITHICALLY INTEGRATED PLANAR BROADBAND WAVEGUIDE AND SOLAR PHOTODETECTOR. The entire contents of each of the above-referenced patent applications are hereby incorporated by reference.

Portions of this patent application may also relate to U.S. patent application Ser. No. 13/357,451 filed Jan. 24, 2012 entitled "Leaky Solar Array with Spatially Separated Solar Collectors"; the entire contents of which are also hereby incorporated by reference.

BACKGROUND

1. Technical Field

This patent application relates to a monolithically integral solar energy device and related devices.

2. Background Information

The integration of photonic devices for low-cost on-chip optical interconnects is of great interest for high speed computing. Additionally, there is a desire in the solar energy industry to tap the potential high theoretical conversion efficiency of rectennas, where highly concentrated coherent light in a waveguide could enable higher rectenna efficiencies.

One of the key elements for both end uses is the efficient integration of a waveguide and a photodetector. Coupling of light from a planar waveguide to a monolithically integrated photodetector or rectenna can be accomplished in several ways, but it has remained a challenge to do so with high efficiency across a broad spectral band.

SUMMARY

This invention concerns the efficient coupling of light in a planar waveguide/photoconversion device. It augments the feature of spectral separation which is advantageous for both wavelength division multiplexing in optical communications to increase bandwidth, and solar conversion to increase efficiency. The structures provide evanescent coupling, butt coupling and vertically coupled total-internal-reflection (TIR) type arrangements.

A light or other electromagnetic energy concentrator module consists of a prism, a waveguide core, and uniform thickness gap layer disposed between them. Photovoltaics (in the case of a solar application) or nantenna structures (more generally) are disposed adjacent the waveguide core. An optional multi-layer cladding restricts angular deviation; certain optional embodiments also include gratings and spectrally filtered coupling.

More particularly, an electromagnetic energy concentrator includes a prism, and a waveguide aligned with the prism. The waveguide includes a waveguide core layer. A gap layer of uniform thickness is disposed between the prism and waveguide. Energy detectors, which may be photovoltaics or nantenna elements, are disposed adjacent to and co-extensive with a second surface of the waveguide. The detectors may be placed in one or more cladding layers on the second surface of the waveguide.

In a preferred arrangement, the detectors are operative in each of at least two bands, and the horizontal spacing between detectors operating in a given band depending on the wavelength of that given band. The detectors may also be vertically positioned with respect to the prism, such that that distance depends on 1/e.

The detectors may also be disposed in a homogenous carrier layer, or may be disposed in two or more layers such that detectors operative in one band are disposed in a different layer than detectors operative in another band.

Gratings may be disposed adjacent each detector such that the gratings each comprise multiple elements, with a spacing between adjacent grating elements depending on a position with respect to the waveguide that further depends on an operative wavelength of the adjacent detector. In this arrangement, the grating element spacing is preferably chirped; the size of the grating elements can also depends on their respective horizontal position.

Elongated strips of material can be disposed within the waveguide core such that the strips have an index of refraction the same as an index of refraction of the prism. This helps equalize dispersion of the prism to dispersion of the waveguide.

A dichroic filter stack can be disposed adjacent the waveguide and the detectors wherein the dichroic filter is formed from a multiple layer stack.

In still other implementations, one or more internal reflection mirrors are disposed embedded in waveguide to further direct solar energy to the detectors.

In still other implementations, the detectors include MIM rectennas disposed in vertical series adjacent each mirror.

The detectors may also include a plurality of bowtie shaped antenna elements arranged as an array in at least two dimensions.

The device can be made by locating a prism portion as a substrate; depositing a coupling layer on the prism; depositing a core waveguide on the coupling layer; and placing a set of periodically spaced photovoltaics on the core waveguide layer.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 3A and 3B show gratings disposed adjacent the homogeneous and multi-layer configurations;

FIGS. 4A and 4B illustrate embedded material strips and the resulting improved efficiencies possible;

FIGS. 5A and 5B show a multi-layer photovoltaic arrangement in more detail with an index profile;

FIG. 11 is an embodiment using multiple MIM detectors in a vertical stack;

DETAILED DESCRIPTION OF AN ILLUSTRATIVE EMBODIMENT

1. Introduction

There are many applications for coupling light into a thin optical waveguide. Most techniques for coupling, such as grating coupling and prism coupling, are inherently narrowband due to the dispersion of the waveguide. In the case of prism coupling, the incoming wave typically must be a plane wave, and must also be input at an angle that is commensurate with the effective index of the waveguide, given the prism and gap material dispersion over the spectral band of interest.

Figure 1:
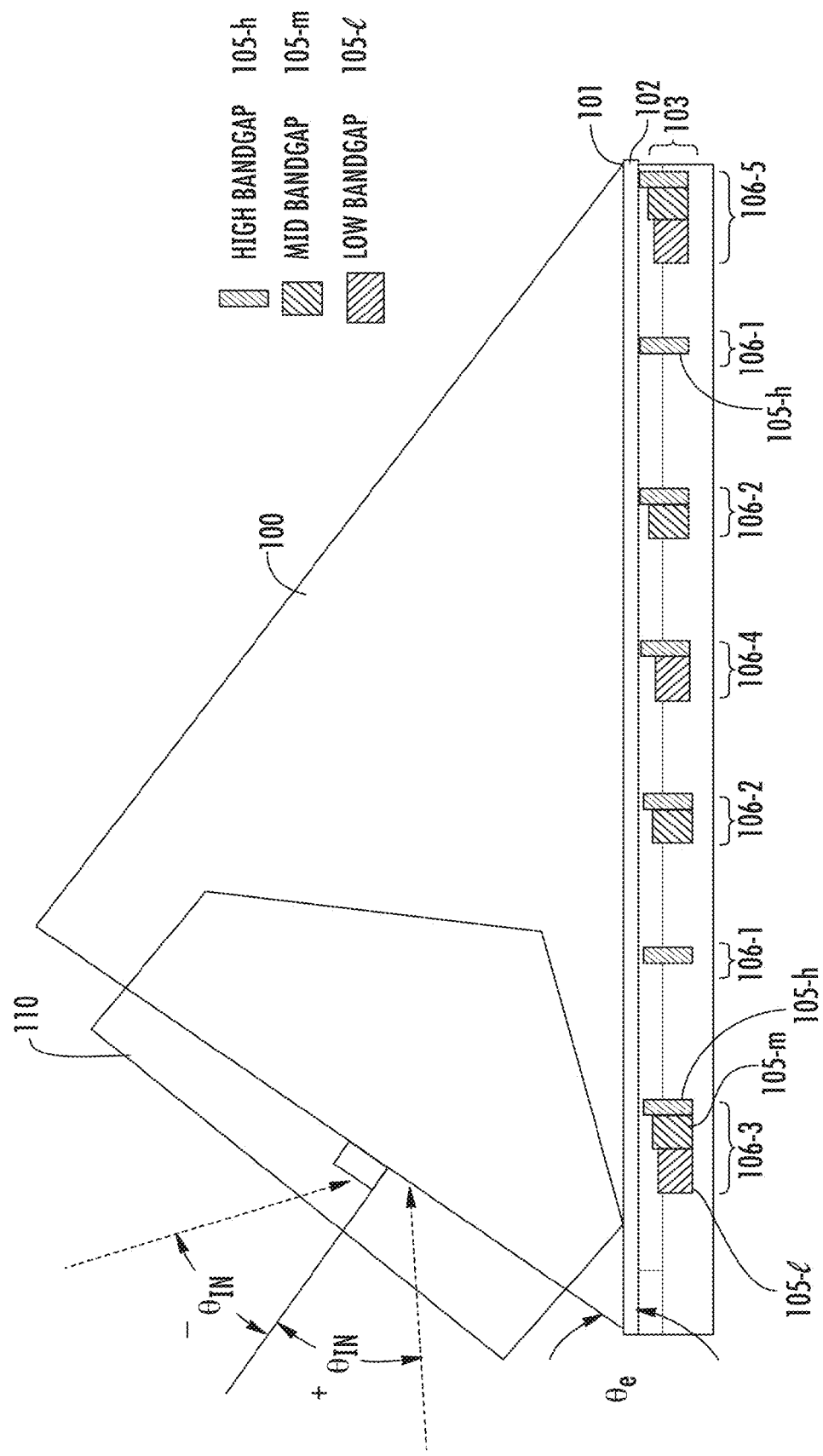
FIG. 1 is a prism coupled optical waveguide using spatially separated photovoltaic collectors.

FIG. 1 is one example of a prism-coupled waveguide approach to a solar collector that improves over other designs. A prism 100 is placed over a waveguide core 102; the waveguide core 102 may also be composed of one or more cladding layers 103 placed on a face of the core opposite the prism 100. The waveguide core 102 has a major axis (the horizontal plane in FIG. 1) aligned with the prism 100. A gap layer 101 is preferably disposed between the prism 100 and the waveguide core 102. One or more photovoltaics 105 are disposed within or adjacent (e.g., below) the cladding layers 103 (also referred to herein for certain embodiments as the "photovoltaic layers").

Incoming light reaches the prism 100 and is then coupled to the waveguide core 102 after travelling through the gap 101. The incoming light is coupled at angle θin to a prism face of angle θp to the horizontal plane. This angle θin of coupling is defined in equation (1) (below) as a function of the index of refraction of materials (np for the prism, and neff for the effective index of the waveguide.

$$\theta_{in} = \arcsin\left\{ np * \sin\left[\theta_p - \arcsin\left(\frac{neff}{np}\right)\right]\right\}$$  (1)

where
np refers to the prism 100 index of refraction;
ng refers to the gap 101 index of refraction;
ncore refers to the core 102 index of refraction;
nclad refers to the cladding 103 index of refraction; and
neff is the effective index of refraction of the core and cladding together.

By optimizing the material used for the cladding 103 and geometric properties to control the desired effective index of the waveguide (neff), the collector can be optimized to produce a single or narrow range of angles that will allow a large spectral bandwidth to be efficiently coupled into the waveguide 102.

Previous attempts at altering the prism 101 material properties for a given waveguide have, via modeling, produced a 110 nm spectral bandwidth in the visible wavelength region. There a prescription for a fictitious material was designed; see Optics Communications 136(1997) 320-326, Mendes, Sergio B., et al., "Achromatic prism-coupler for planar waveguide". With the structure in FIG. 1 we have obtained less than a 0.4 degree beam width from 400 nm to 1200 nm, or an 800 nm spectral bandwidth, using actual materials that have already been produced with known chemical vapor deposition recipes.

As mentioned above, one or more dielectric cladding layers 103 is desired to abut the waveguide core 102. However, this can present a problem during integration and assembly of the waveguide 102 and photovoltaic cells 105. For better efficiency, the PV cells 105 should abut the waveguide core 102, and so they cannot be bonded to the cladding 103. In one embodiment therefore, there is no physical cladding layer 103 beneath the waveguide core; rather air is used as the dielectric "cladding". This simplifies the manufacturing process by allowing the waveguide core 102 to be bonded directly to one or more PV cells 105. In this configuration, due to the lack of any physical cladding material, the air beneath the waveguide core is considered the cladding of the waveguide. This type of waveguide actually confines fields within the core to a greater degree than other arrangements.

This "air cladding" arrangement also lends itself to an improved manufacturing process. Using the bottom of prism 100 as a substrate, coupling layer 101 is first deposited. Next, the core waveguide 102 is deposited, and then a third layer consisting of periodically spaced photovoltaics 105 can be deposited or affixed to the core waveguide layer. An electrical backplane (not shown) can then be affixed to the assembly.

2. Horizontal Position of PVs Depends on Wavelength

Continuing to refer to FIG. 1, a plurality of photovoltaic cells 105 of different wavelengths appropriate for each band (that is, sets of cells 105 corresponding with each wavelength region of the solar band of interest) line the waveguide 102 and/or cladding 103 surfaces where collected energy is incident.

In a preferred arrangement, there are multiple PVs disposed along the waveguide surface at one or more collector regions 106-1, 106-2, . . . , 106-5. For each distinct solar wavelength band of interest, there exist photovoltaic cells that are very efficient. Tuned dielectric coatings (not shown in FIG. 1) can be added to or near each PV cell 105 to accept only in-band solar energy of interest.

The solar wavelength bands can be divided in any number of ways, including 1) multiple single-junction, single-band PV devices, 2) multiple multi-junction, multi-band PV devices or 3) any combination thereof. The actual division and distribution of these options is optimized based on the responsivity of each device, with respect to overall efficiency across the entire solar band.

In the structure shown in FIG. 1, a long, constant thickness coupling layer 101 formed of a material such as MgF and of the order of several millimeters is desirable for several reasons. The long coupling layer lends itself to the use of a large prism wedge 100 covering a multitude of focusing regions which would ordinarily require a wedge for every focusing region. This allows a relatively long photovoltaic layer 103 to be used with the single prism 100. Another advantage of providing a correspondingly long photovoltaic layer 103 is the ability to increase the concentration of energy in the longer wavelength bands, since the efficiency of a photovoltaic device increases with concentration. In previous configurations, a focusing region of 50 microns and an exponential taper in the coupling layer were used to keep the beam width at 0.5 degrees and maintain efficiency at 400 nm. The disadvantage of this 50 micron constraint is not only loss of concentration at the longer wavelengths, but the difficulty of manufacturing an exponential taper.

Figure 2A:
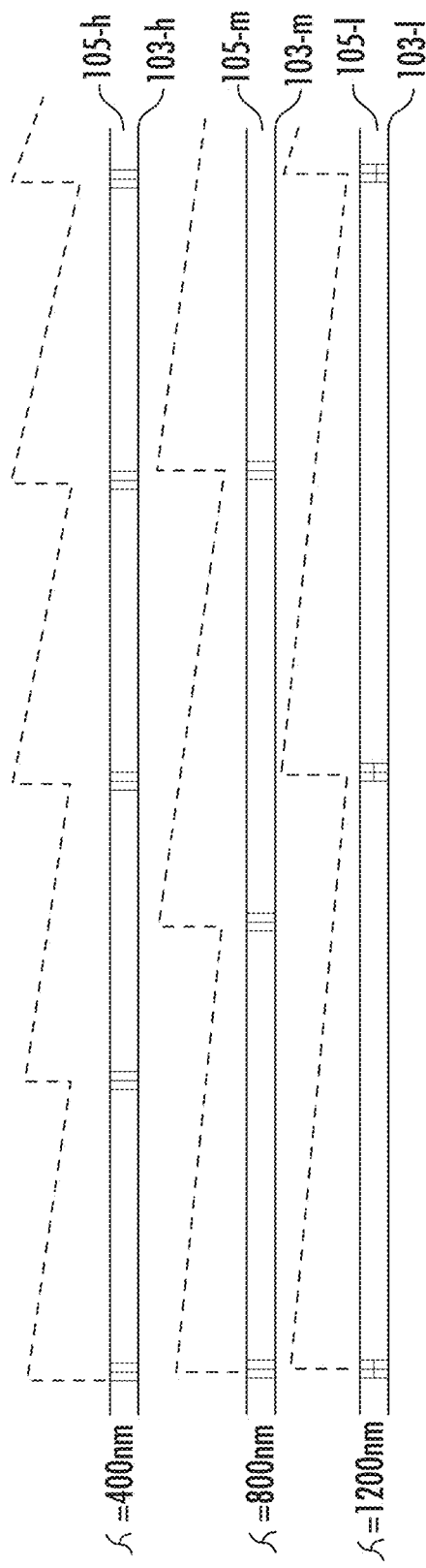
FIGS. 2A and 2B illustrate a homogeneous and multi-layer arrangement, respectively.

As shown in FIG. 1, using a relatively long, constant thickness coupling layer 101 allows multiple arrays of photovoltaic (PV) devices 105 to be used in each collector. As shown in one example embodiment of FIG. 2A, each of the three solar bands will have its own photovoltaic array, optimized for each of a respective one of a high band gap 105-$h$, medium band gap 105-$m$, and low band gap 105-$l$. In FIG. 2A the three bands are shown separately with the positions of the photovoltaic devices along the separate layers. The incident sunlight excites the fields in the layers as shown by the dotted lines. The fields are seen to increase in the focusing regions until most of the field is absorbed by the photovoltaic devices 105. This behavior is repeated along the layer with complete absorption of the incident field resulting.

In the illustrated implementation the spacing between the 400 nm photovoltaic detectors is 50 microns. The PVs operating at longer wavelengths are disposed with progressively wider spacing to coherently absorb more light while maintaining a 0.5 degree beamwidth. For example, the spacing of the 800 nm detectors can be 100 microns, and that of the 1200 nm detectors 150 microns. Thus, the spacing between PV's in layer(s) 103 depends on the respective operating bands of the PVs as well as the desired beamwidth.

Figure 3C:
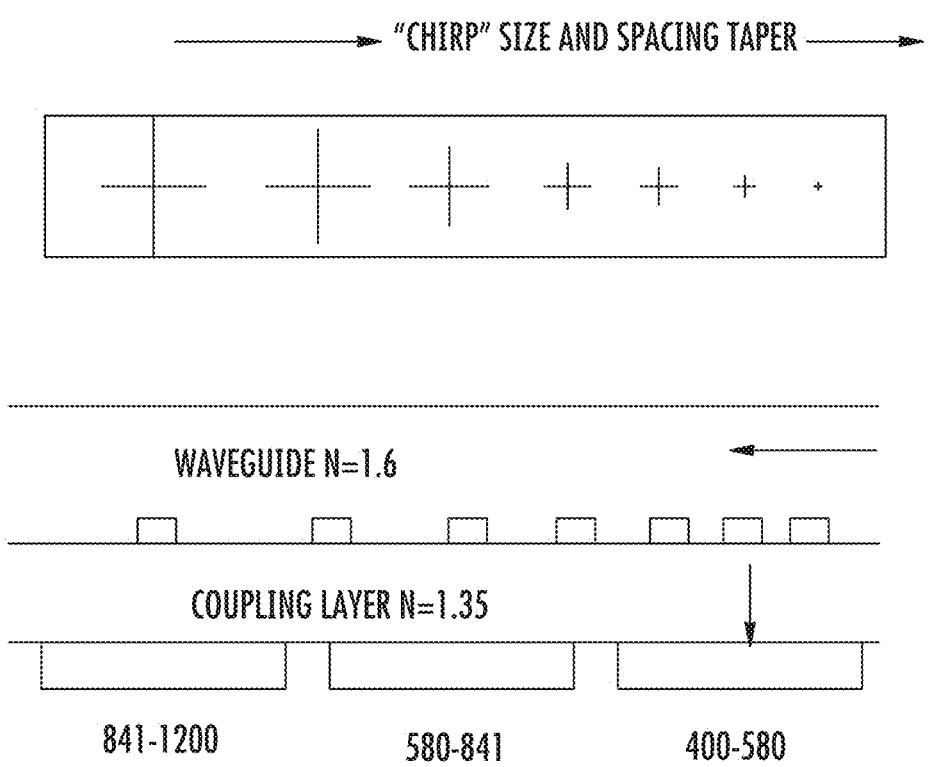
FIG. 3C shows one possible homogeneous implementation in more detail.

In another arrangement, a single composite photovoltaic layer 103-$c$ is seen in FIG. 3B that contains all of the PVs 103-$l$, 103-$m$, 103-$h$.

There is possibly a sight wavelength dependency in the coupling layer 101 from 400 m to 1200 m. That dependency, if considered critical, can be mitigated by implementing a three layer coupling layer 101 in some embodiments, using the configuration shown in FIG. 2C. Magnesium fluoride is the 1.4 material while titanium dioxide is the 2.5 material.

The aforementioned waveguide design was intended for the capture and concentration of solar energy, although the design can be tailored for operating in other optical wavelength regions, such as those used for optical communication systems.

3. Vertical Position of PVs Depends on Wavelength

Evanescent coupling of light within the waveguide to photovoltaic cells 105 can be further encouraged by matching the PV cells' 105 penetration (e.g., vertical position) in the waveguide 102 to their respective 1/e field strength confinement location. This location is defined as the depth (or penetration) into the waveguide at which the cross-sectional power is 1/e of its peak value. The power density for the lower wavelengths is greater at the core 102 center; this is because as the wavelength increases, more energy travels down into the cladding layers 103. The result is that the light activating the relatively high energy band gap cells 105-$h$ (those which are operative at the shorter wavelengths) will penetrate the furthest into the waveguide, and the light activating the lower band gap energy cells 105-$l$ (operative at the longer wavelengths) will penetrate the least, as shown in FIG. 1.

Figure 2B:
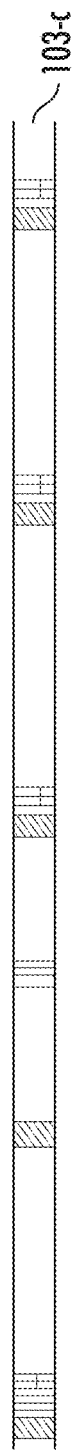
Figure 2C:
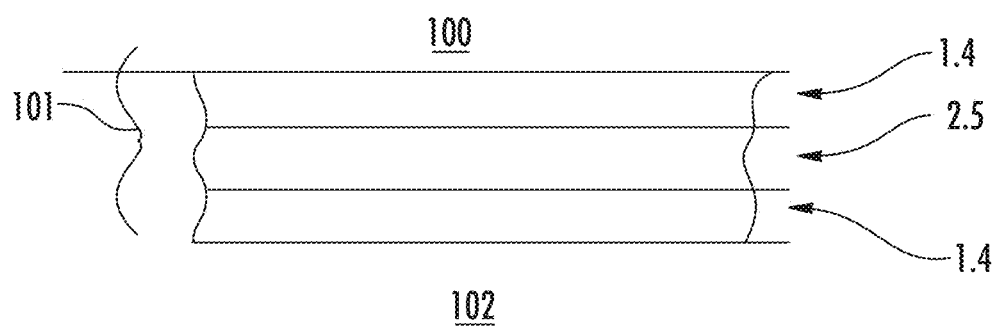
FIG. 2C is a multi-layer gap layer.

As higher band gap cells 105-$h$ typically have a higher absorption coefficient, the coupling length is shorter, and these cells will be smaller in width along the horizontal. If one considers the PV as elements in an antenna array, it will be seen that the separation between the PVs will be commensurate with their wavelength band or band gap. This is also depicted in FIGS. 1, 2A and 2B. As such, the spectral beam width will be equalized across the solar spectrum.

Selectively choosing the relative depth position of the PV 105 within the waveguide thus acts as a spectral filter for coupling the desired portion of the spectrum to the respective PV cell 105. This allows for maximum efficiency of the spatially separated band gap optimized cell architecture. It also potentially alleviates the need to place band pass filters on the PVs 105.

FIG. 1 shows this preferred vertical placement of the different band gap PVs (as suggested above). The shorter wavelength PV (high band gap) 105-$h$ is encountered first, and since the shorter wavelength energy is less confined, a portion of the energy transits into that PV via leaky-wave propagation (the PV is a higher index than the waveguide). The middle and longer wavelength energy is unaffected because it is more confined and travels vertically down the waveguide until it encounters the next PV, optimized for middle wavelength energy. The middle wavelength energy leak-wave propagates into the middle wavelength band-gap optimized PV 105-$m$. This process continues until longer wavelength (low bandgap energy) PV 105-$l$ is encountered.

The distance between the PV 105 and the waveguide core 102 is optimized such that the PVs can absorb the maximum amount of energy per unit length from the waveguide 102, without impeding or affecting the adjacent band.

4. Homogeneous and Multi-Layered PV Layers

FIGS. 3A and 3B show the implementations for a multilayer PV and single (homogeneous) PV layer embodiment in more detail.

Shown specifically is a region such as region 106-3 containing all three band gap PVs. In FIG. 3A the shortest wavelength (highest band gap) PV 105-$h$ active from 400-580 nm, is located in a PV layer 103-$h$ closest to waveguide 102. The longest wavelength PV (lowest band gap) 105-$l$ (active from 840-1200 nm) is located in a layer 103-$l$ farthest away from waveguide 102. The medium band gap PVs 105-$m$ (active from 580-840 nm) are placed in a middle layer 103-$m$.

5. Gratings Placed Near PVs

FIGS. 3A and 3B also shows energy from 400 to 1200 nm propagating from left to right and interacting with various grating structures 210 placed adjacent each PV 105. The grating structures 210 further assist with directing light energy of the appropriate wavelength into the corresponding PV.

The propagation to the respective photovoltaic 105 is governed by the element spacing of each grating 210. For a given element spacing, the longer the wavelength and the less propagation, until finally a cutoff wavelength is reached where propagation is zero. For example, the element spacing for grating 210-$h$ is chosen such that is can direct all of the light energy at 400-580 nm into its corresponding 400-580 photovoltaic 105-$h$, while light at the longer wavelengths is not. The same can be said of the grating 210-$m$, which delivers all energy it receives at 580-840 nm into its corresponding photovoltaic 105-$m$, with the 840-1200 nm band energy passing through unattenuated until it reaches grating 210-$l$.

Towards this end, the spacing of the elements that make up each grating preferably changes along the length of each grating 210, in a chirp like fashion. Comparing the various gratings 210-*h*, 210-*m*, 210-*l*, it is also preferred that they collectively exhibit a chirp taper to their element lengths.

The size of the elements that make up each grating 210 can also similarly vary. For example, the grating element size used for grating 210-*h* used with the 400 nm PV 105-*h* can be ⅓ the size of the grating element 210-*l* used for the 1200 nm PV 105-*l*. Tapering the element size in this way acts as a high pass filter between the waveguide 102 and the photovoltaics 105, since Rayleigh scattering is involved where the element response is 1/(wavelength) to the fourth power.

The chirp spacing between elements of each grating can be determined by λ/2 where λ is the wavelength at the center of the band of interest of each respective photovoltaic, and where there are approximately 10 grating elements per photovoltaic.

The size of the larger elements can also be made relative to the element size chosen for the shorter wavelengths (e.g., 400-500 nm). See FIG. 3C for an example. The overall length of each grating may, for example be 13 microns.

6. Embedded Material Strips Equalize Dispersion in Prism and Waveguide

For the traveling wave structure to receive solar energy over a broad band, high efficiency in receive must be achieved without changing the elevation angle. To do this, one should achieve a uniform mode match for both horizontal and vertical polarizations across frequency, between the wedge and the waveguide. Because most materials suitable for use as the prism 100 are inherently dispersive across the solar band, we correct for dispersion within the waveguide to "mode match" across the entire band. This mode match involves matching dispersion curves of the prism 100 and waveguide 102. When this is achieved, the concentrator has high receive efficiency at the same receive angle across all wavelengths of interest. The concentrator is then aimed at the source (the sun) at this angle.

This mode matching can be achieved over a broadband and over polarization by inserting strips of material 230, preferably rectangular in shape, within the waveguide 102 that have the same dispersion characteristics of the prism 100. FIG. 4A is an example implementation. The height to width ratio of these strips 230 is experimentally determined until mode matching occurs over a broad band. The width (w) and height (h) are controlled independently, and each affect orthogonal polarizations independently.

Figure 4B:
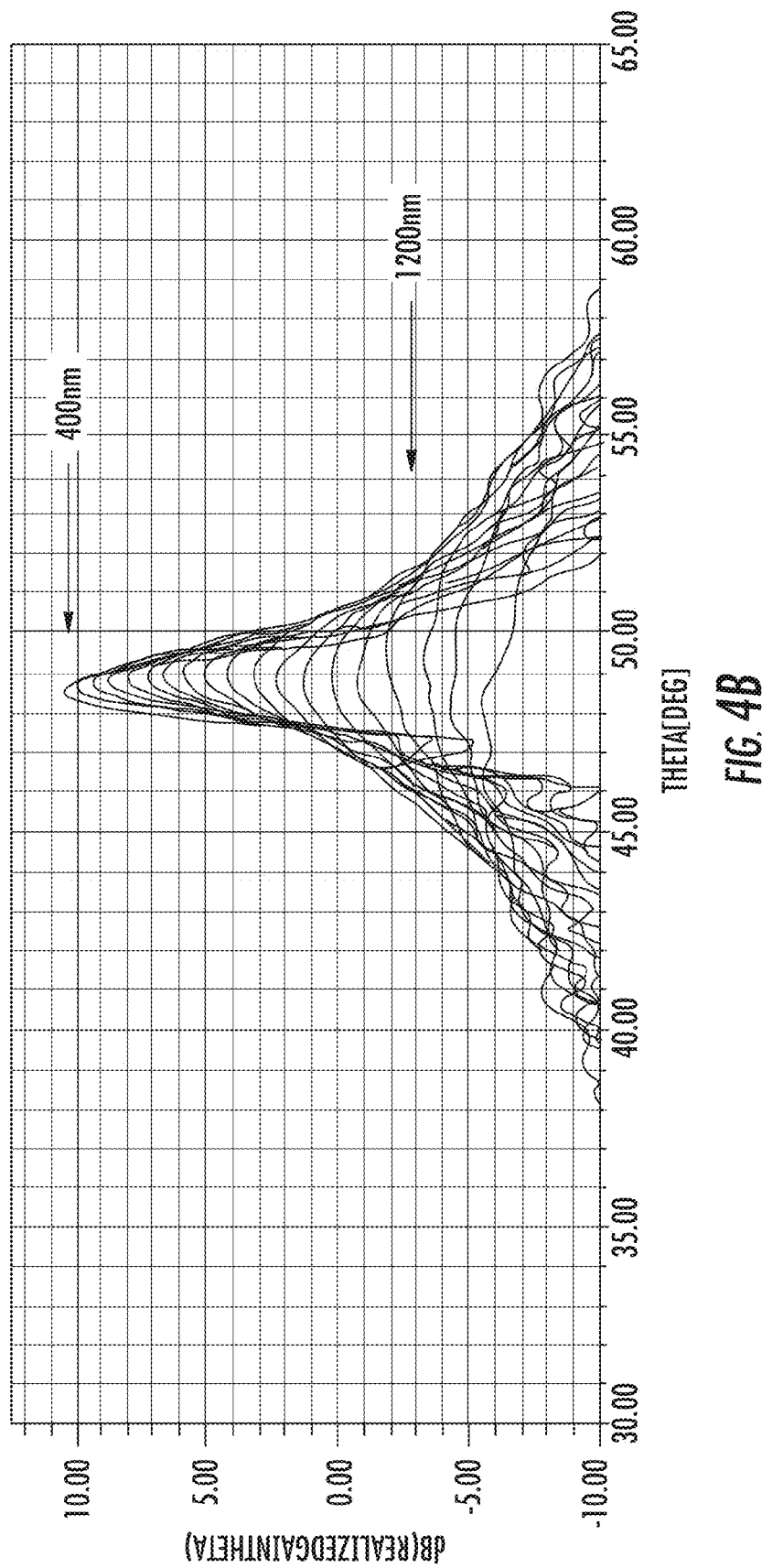

The illustrated example involved a TiO2 (titanium dioxide) prism 100 and a core 102 waveguide formed of SiO2 (silicon dioxide). The correcting strips 230 (made of TiO2) are embedded into the SiO2 and optimized to obtain the desired performance. FIG. 4B is one such set of performance curves.

The performance can be characterized by the equation $$\cos(\theta) = \frac{\beta(\text{waveguide})}{\beta(\text{wedge})}$$

where the β's are the respective propagation constants of the waveguide 102 and the wedge 100. The sizes of the strips 230 are adjusted until the ratio is constant over all wavelengths of interest and both the horizontal and vertical polarizations.

When the desired mode matching is achieved, receive efficiency lines up within the same angular region, as depicted in the receive efficiency chart in FIG. 4B. This figure was generated using a High Frequency Structural Simulator (HFSS) model that included both the horizontal and vertical polarization across the 400 nm to 1200 nm range.

7. Waveguide Composed of a Core and Multiple Cladding Layers

The device can also achieve dispersion tailoring using a multi-layered cladding 103, applicable to both the solar case and operation at other wavelength regions. The particular region chosen for proof of design was 400 nm to 1200 nm.

Given a prism 100 made from Ohara S-LAH65 with a 55 degree angle (θp), the waveguide 102 design is expected to produce a single angle of incidence coupling over a 400 nm to 1200 nm range by using five (5) closely spaced refractive index layers 103 of specifically designed thickness to tailor the waveguide effective index for a constant ratio of neff/np over the wavelength range.

FIG. 5A shows waveguide index profile design for single angle, broadband coupling. A uniform $M_gF_2$ gap (coupling) 101 layer was used with a core SiON waveguide 102. Four additional cladding (photovoltaic) layers 103 were also provided. The relative thicknesses of the layers are shown in the index profile plot of FIG. 5B.

Figure 6A:
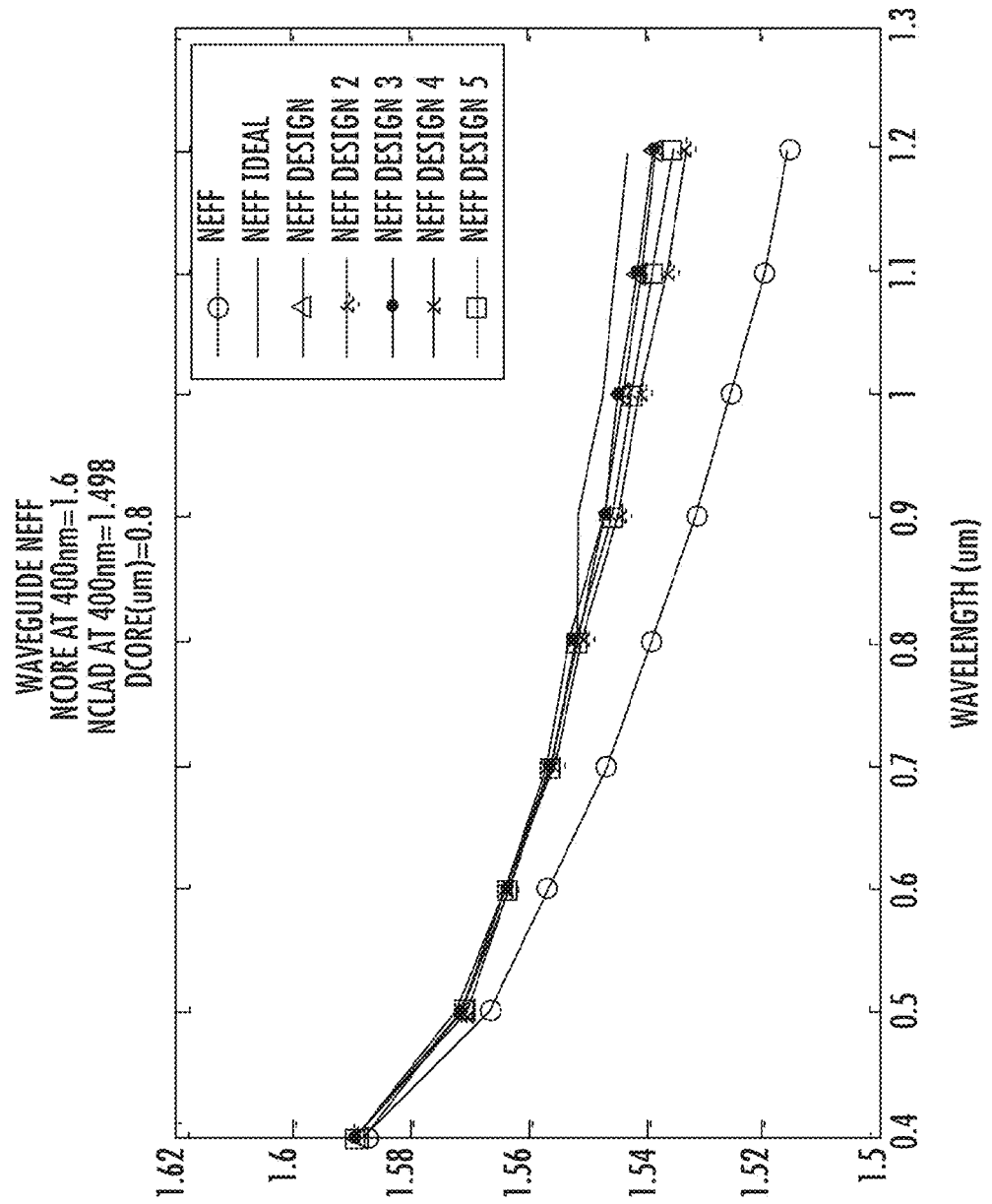
FIGS. 6A, 6B, 6C, and 6D show effective indexes for various configurations.
Figure 6B:
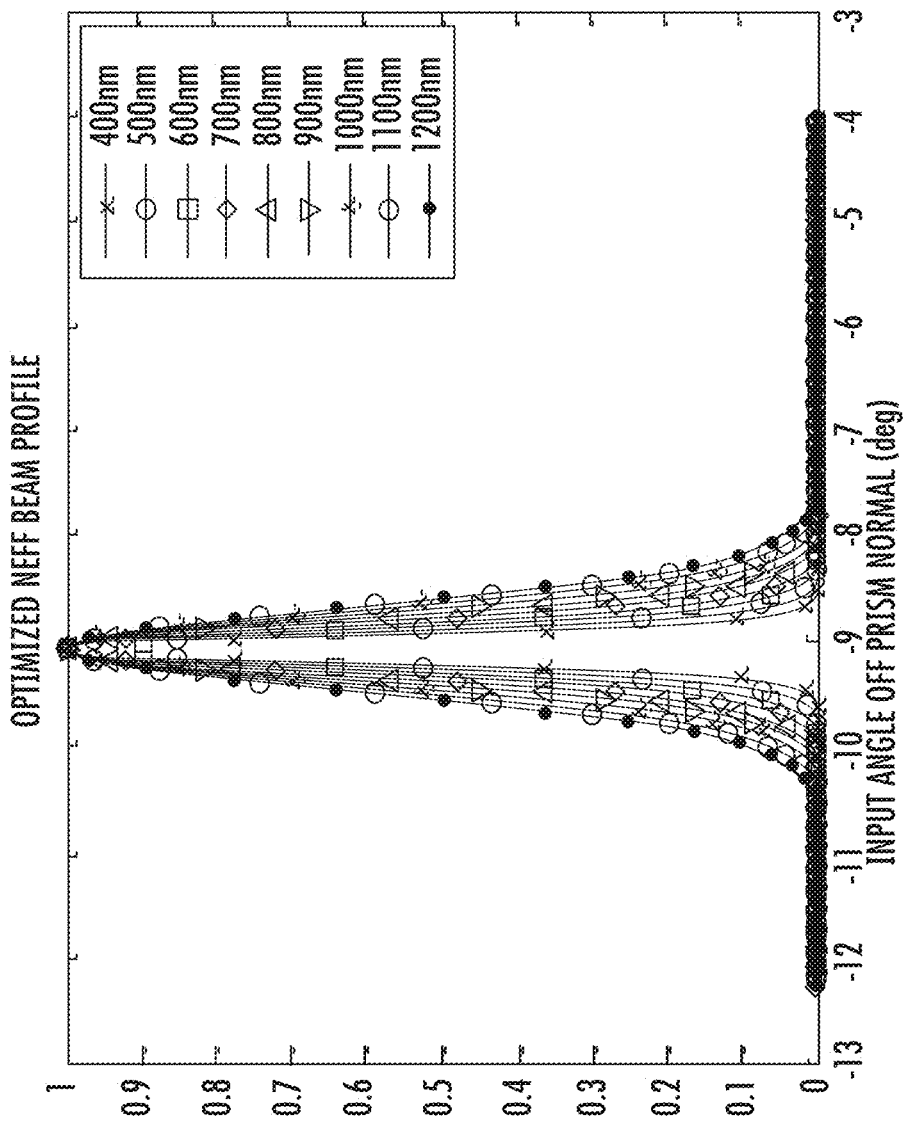
Figure 6C:
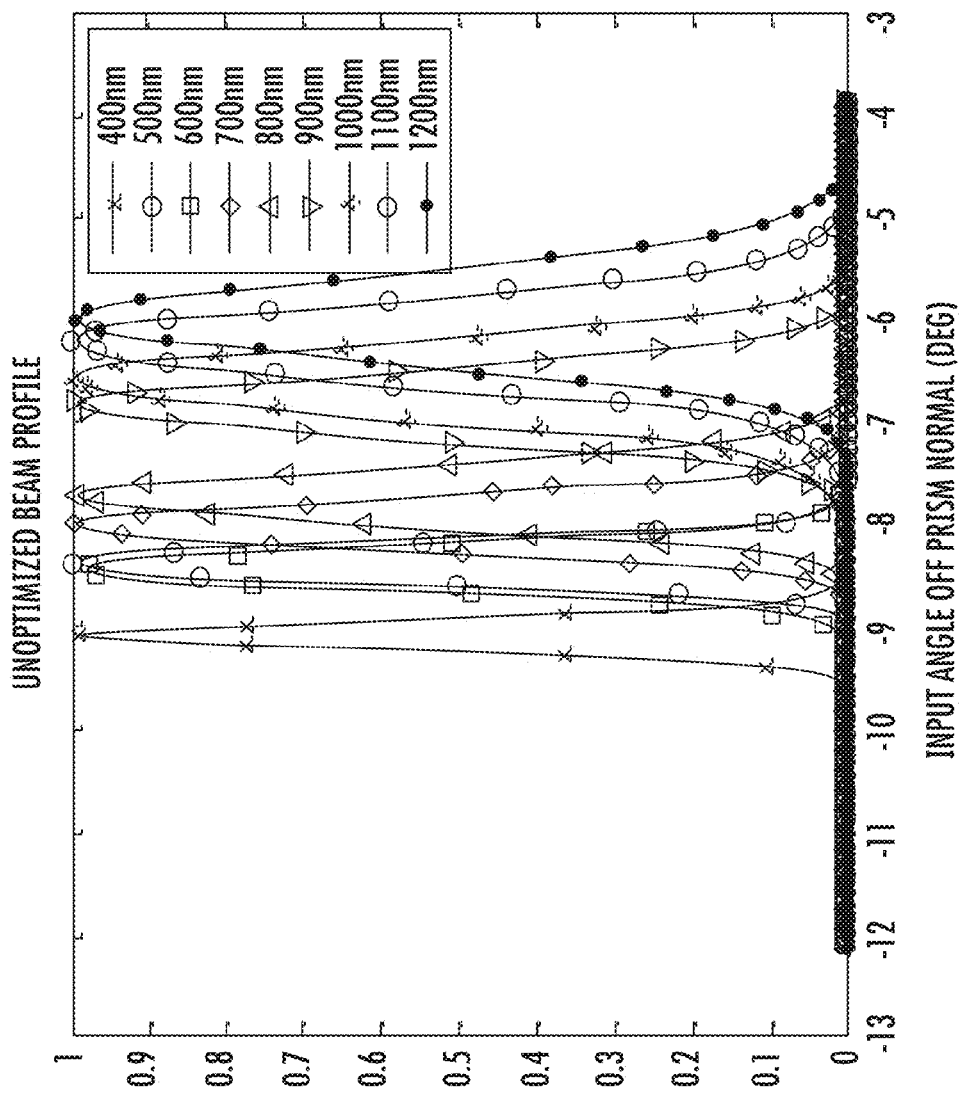
Figure 6D:
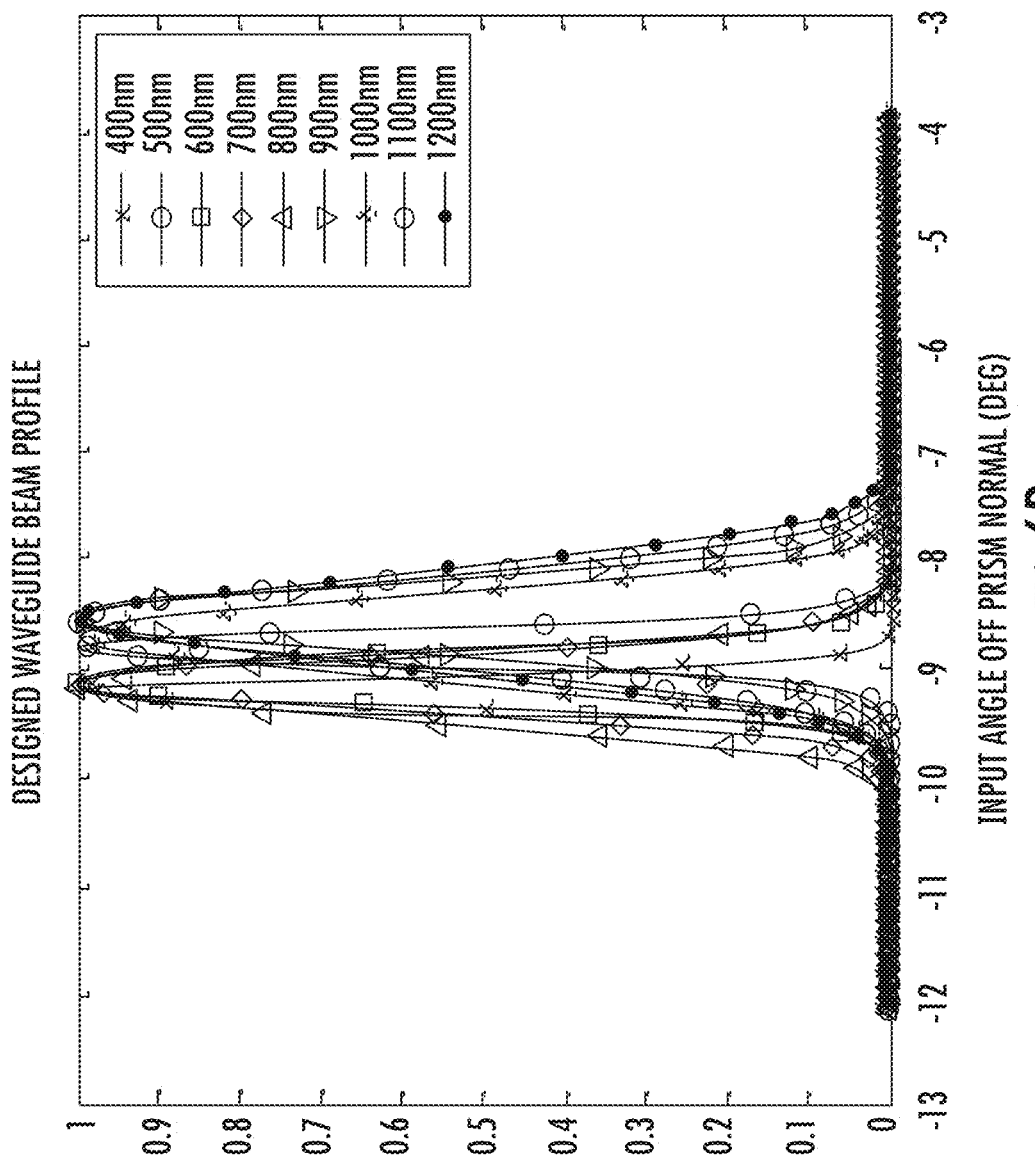

The optimum effective index of the waveguide of FIG. 5A is shown in FIG. 6A, along with a nominal single layer cladding of SiO2, and some design iterations of the cladding. The corresponding input beam width diagram for the ideal dispersion curve is shown in FIG. 6B. The nominal un-optimized single cladding and 5-layer multicladding beam width diagrams are shown in FIG. 6C and FIG. 6D, respectively. While this arrangement provides approximate beam spread to 1 degree, further optimization of the cladding layers is expected to reduce the beam spread to within 0.1 degrees.

8. Embedded Dichroic Filter

Figure 7:
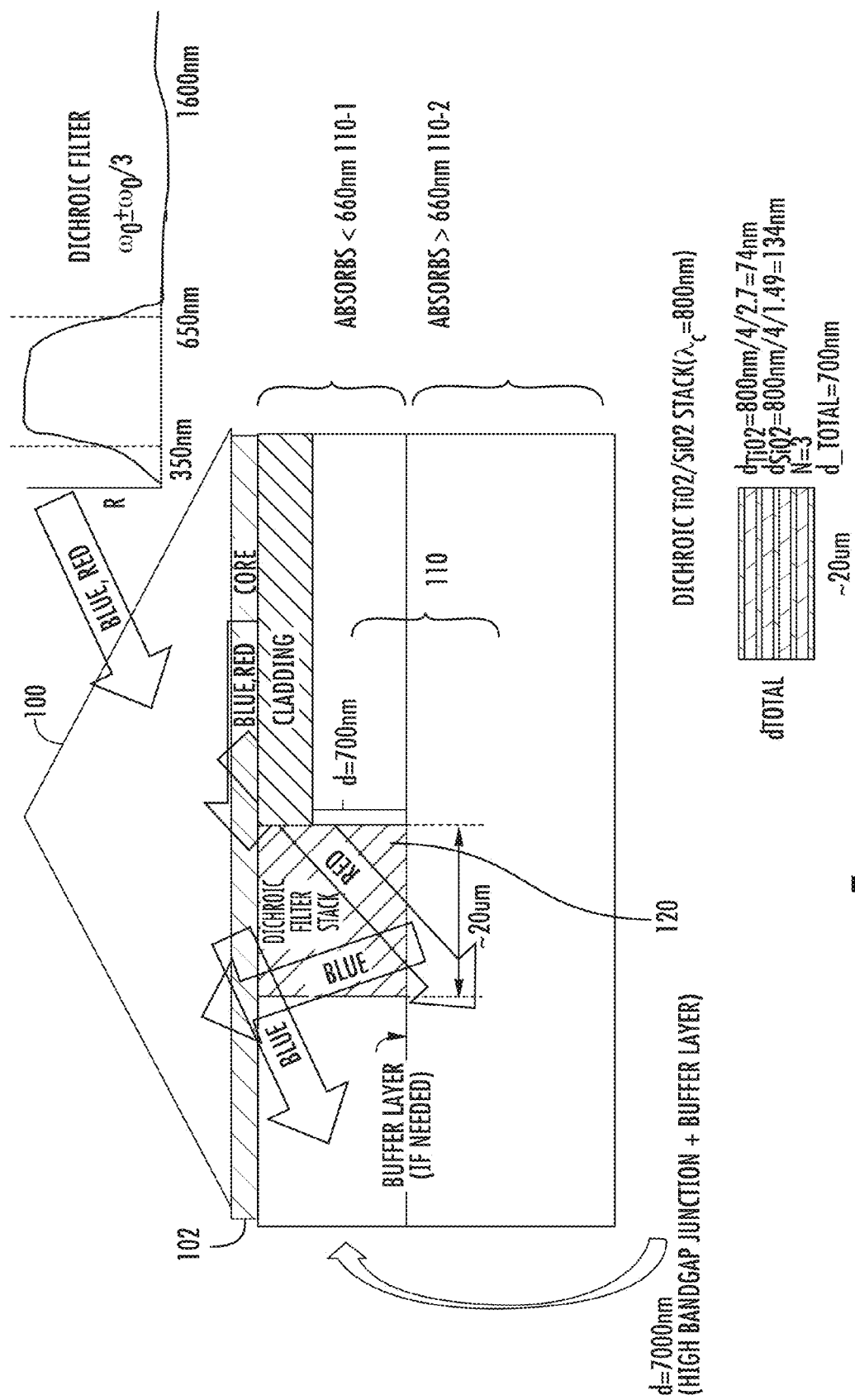
FIG. 7 is an implementation of a solar collector using a dichroic filter stack.

A multijunction photovoltaic structure that monolithically integrates the waveguide while physically and spectrally separating the junctions is shown in FIG. 7.

It is known that the lattice and current matching constraints of monolithic multi-junction solar cells limit their efficiency, while mechanically stacking the junctions or spatially separating the junctions allows more freedom of cell design and band gap optimization for improved efficiency. However, mechanically stacking these cells increases the complexity by introducing additional insulation layers and the handling and processing of thin junction layers. Very often the cells must go through substrate removal, carrier bonding, and thin wafer handling which are not trivial and affect the yield and cost of the devices. Also, creating separate junctions accessed by refractive optics and filters have alignment sensitivities that increase with the number of cells. Shown here is a way to utilize a special monolithically grown multi-junction cell in a spatially and spectrally separated waveguide that retains the simplicity of the monolithic multi-junction cell, while providing the benefits of spatial and spectral separation.

The geometry of a device such as shown in FIG. 7 includes a waveguide input coupling mechanism (prism 100), a waveguide core 102, a custom dual cell photovoltaic 110 and a dichroic filter 120. Each element of the dual cell PV can be a single junction or a multi-junction cell. The flow of light is governed by evanescent coupling to each element of the dual cell and the dichroic filter above the first cell 110-1. The unique element of the design is the etched geometry of the dual cell and the embedded pseudo-omnidirectional multi-layer dielectric mirror above the lower bandgap cell 110-2 (absorbing >660 nm). This multilayer, dielectric pseudo-omnidirectional mirror fits within the depth of the higher bandgap cell 110-1 (absorbing <660 nm), and is embedded by etching out an area outlined by the depth of the high bandgap cell and the evanescent coupling length of the higher wavelength band.

Unlike prior art that seeks omnidirectional reflection across a broad wavelength region, the design of this dichroic filter stack 120 is specific to the mode angles used within the waveguide commensurate with the solar spectrum. This skews the angles of interest to those exceeding the critical angles within the waveguide. The waveguide design is also unique in that it minimizes dispersion across the solar spectrum when used in conjunction with the particular prism (material dispersion).

The specific geometry used within this integrated device, and the integration of the waveguide 102, filter 120, and photovoltaic structure 110 make this device unique. It is the only known multi-junction solar cell device that incorporates light concentration, filtering and band gap optimized photovoltaic conversion in one device. The device is producible via standard wafer fabrication techniques such as metal oxide chemical vapor deposition (MOCVD) and reactive ion etching (RIE).

Details of the construction of the dichroic filter stack are shown in the illustration below the main element. Alternatively, layers of TiO2 and SiO2 are provided with the illustrated thickness and indexes to provide the illustrated reflected spectral response (Wo±Wo/3). Here the thickness of the short wavelength absorbing region may need to be extended via a buffer layer 250 to match the thickness of the filter if the filter is thicker than the short wavelength absorbing region.

9. Mirrors and Optional Dichroic Filters

Figure 8A:
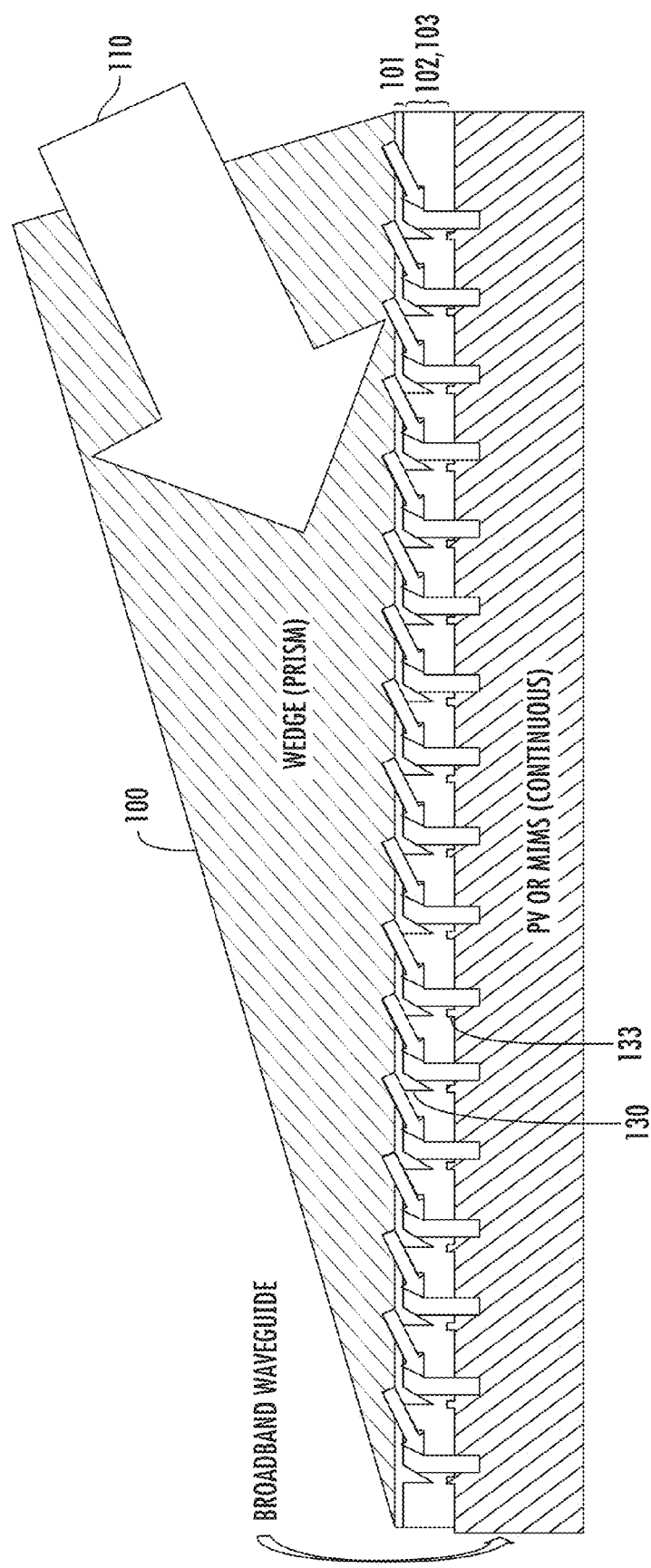
FIGS. 8A and 8B show a broadband coupler using an array of embedded Total Internal Reflector (TIR) mirrors with either continuous or discrete detectors.

FIG. 8A depicts broadband light that has been coupled to a multi-layer waveguide 102, 103 via a prism 100, as before. However in this arrangement, the light collected in the waveguide 102, 103 is coupled to photovoltaic cell(s) 105 via a set of longitudinally spaced, angularly etched TIR mirror(s) 130. Since the size of the spacing between mirrors 130, and hence the linear dimension of light at the prism aperture associated with this length, can be designed to be less than the solar coherence diameter, this device serves as a coherent solar array concentrator. It can use either standard energy gap conversion based photodetectors 105 such as silicon or gallium-arsenide (GaAs), or it can be used with metal-insulator-metal (MIM) tunnel junction rectifiers for direct current output.

Figure 8B:
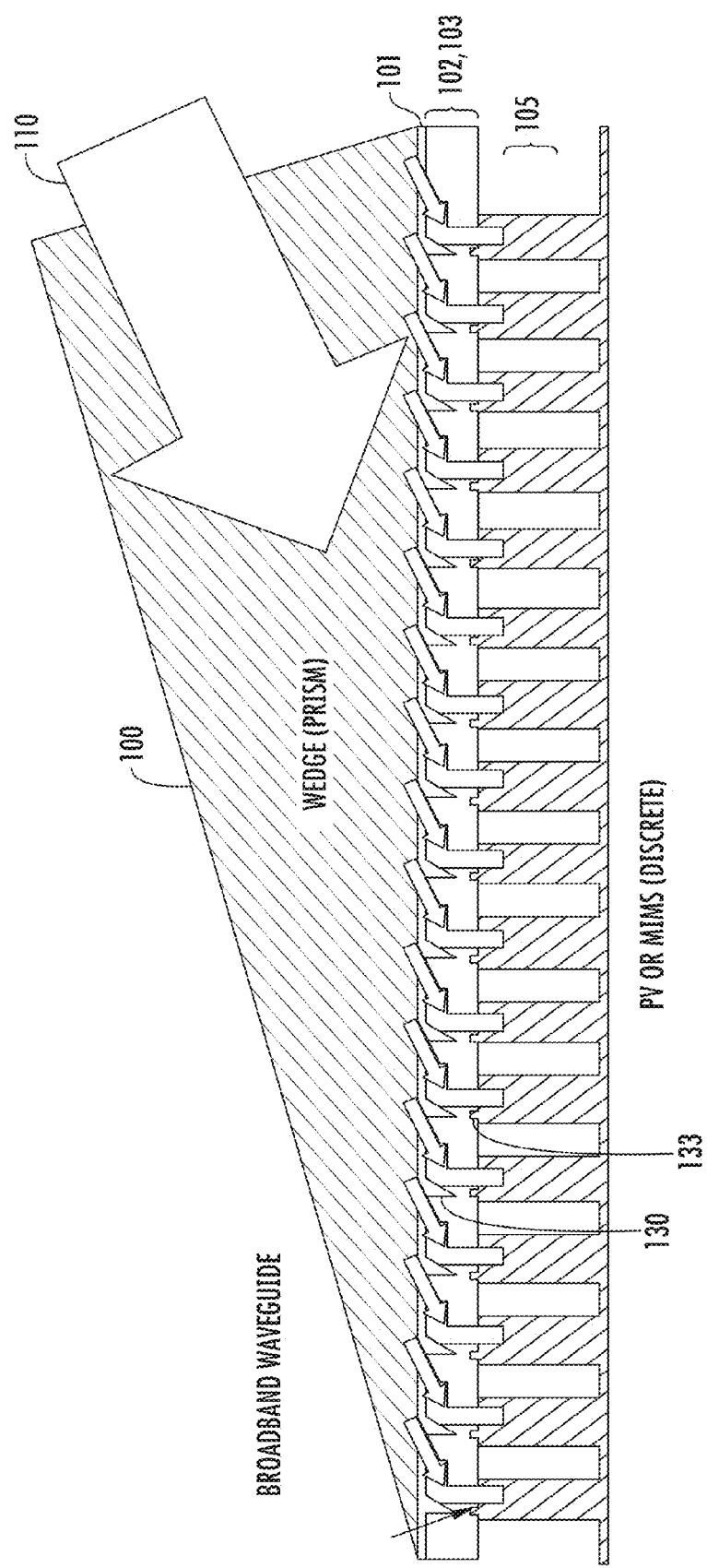

The electrical conversion devices (detectors) 105 can be discrete devices, one for every mirror element 130, or they can be designed to be continuous and defined by their electric contacts 133 as shown in FIGS. 8A and 8B.

Figure 9:
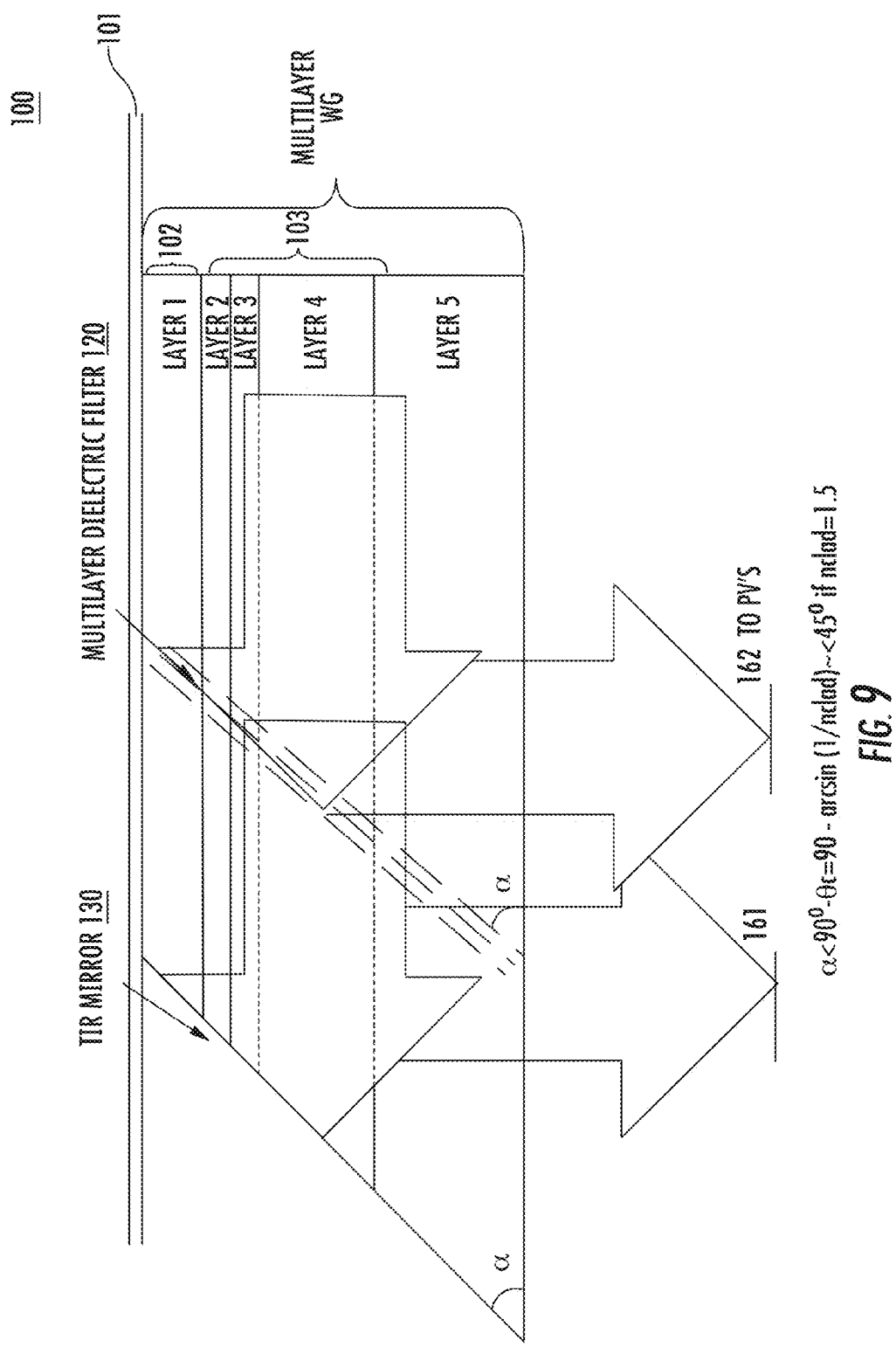
FIG. 9 illustrates intrawaveguide spectral splitting.

An enhanced version of this device can further include intrawaveguide elements that enable the spectral separation of light into different photodetectors operating in different bands. FIG. 9, a more detailed view of each element, shows an instance of incoming light being separated into two (2) wavelength bands using an intrawaveguide dichroic multilayer filter 120. This implementation uses two detectors 161, 162 (InGaAg for the one band and GaAs for the other band), but this can be extended to multiple bands (for example, by disposing additional InGaAs and/or GaAs detectors beneath those shown).

FIG. 9 also shows an equation for the desired angle of the TIR mirror 130 as depending on the lowest index of refraction of the waveguide structure (approximately 1.5 here) resulting in a 45° preferred angle. The angle for the dichroic filter 120 may also be the same or different, depending on the arrangement of the detectors used and their position.

Figure 10:
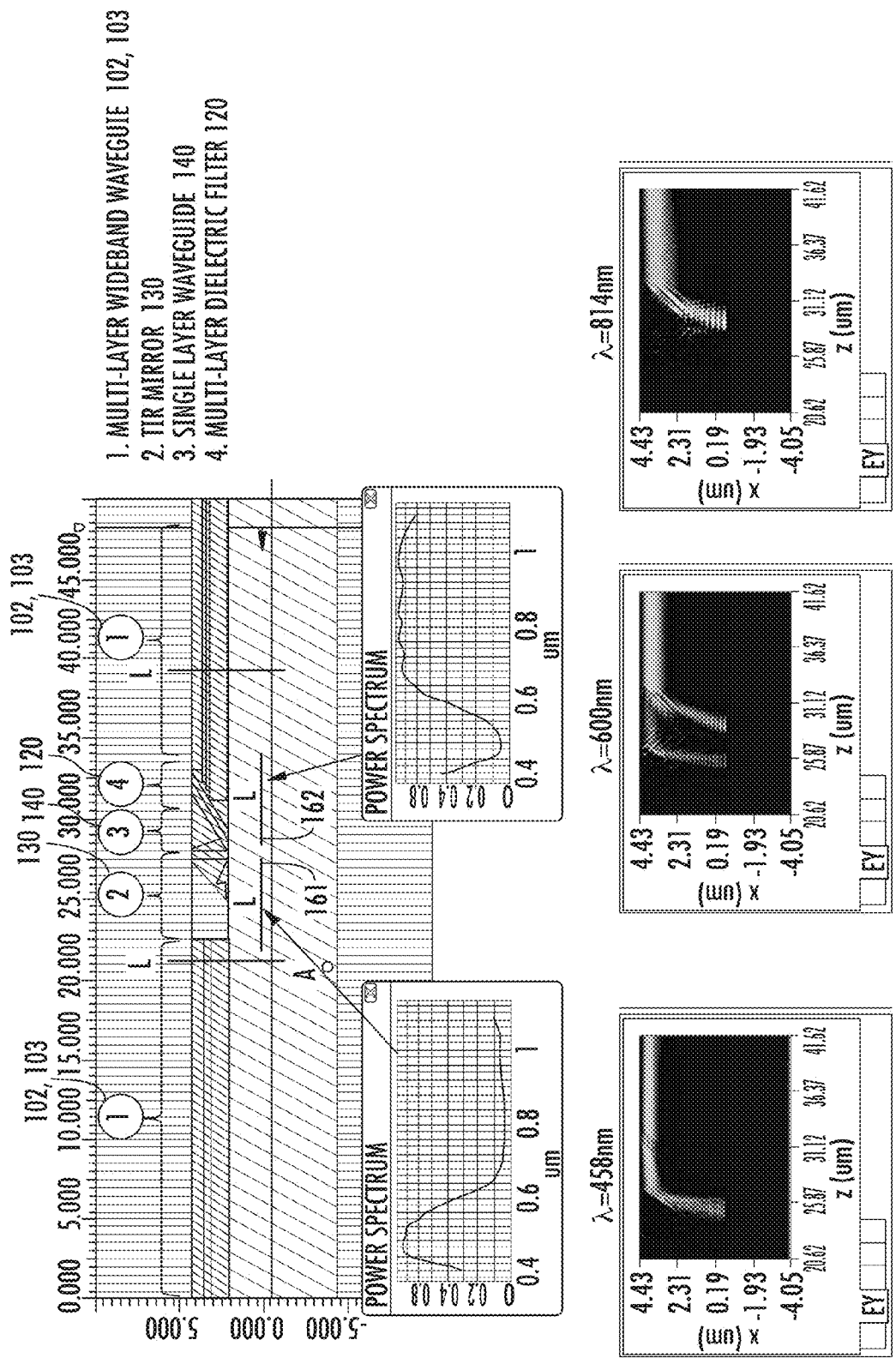
FIG. 10 shows the intrawaveguide spectral splitting in more detail as simulated.
Figure 17:
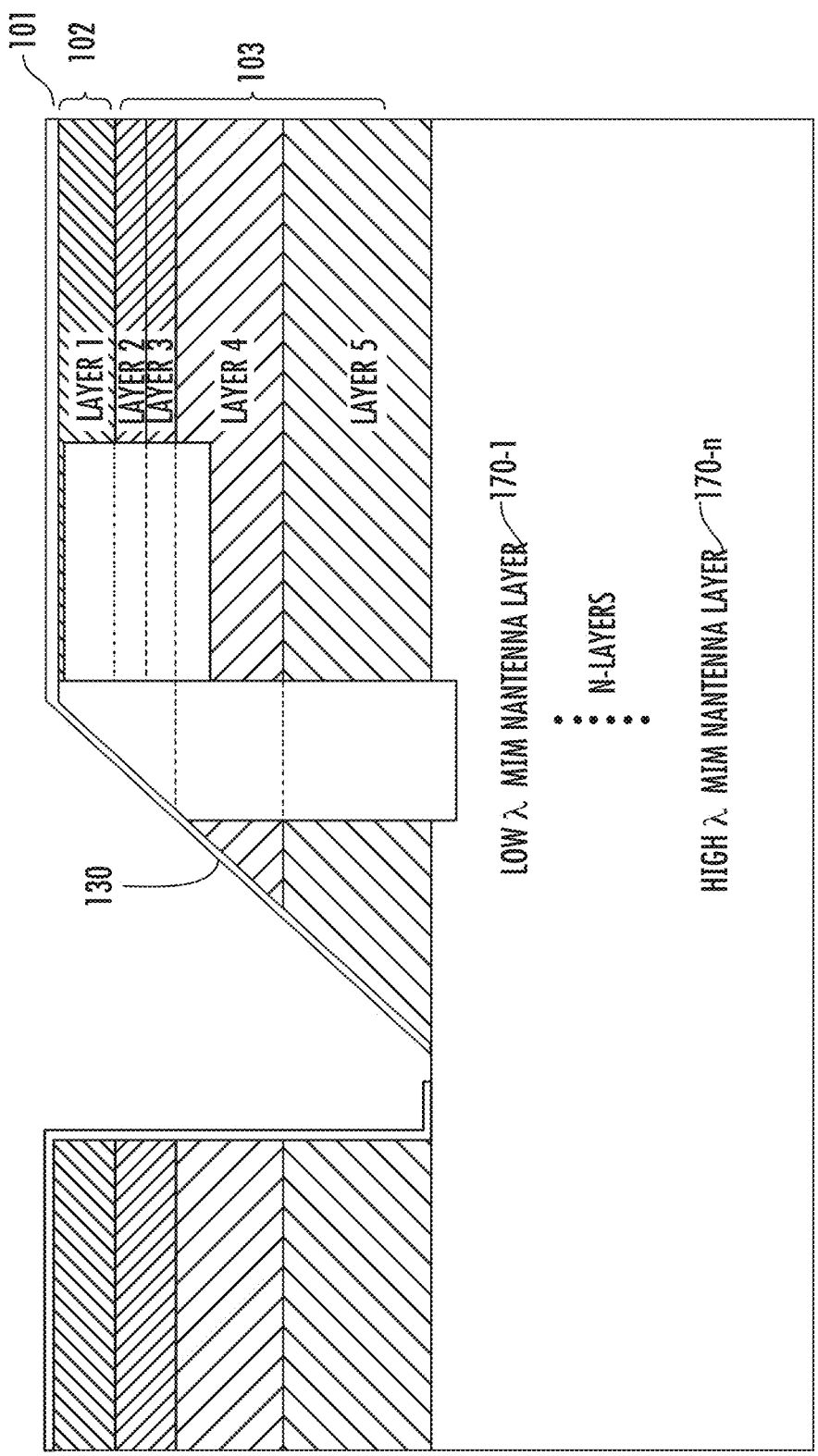

A simulation of the waveguide incorporating both the TIR mirrors 130 and a nominal low Q multilayer dielectric filter shown generally in FIG. 9 is shown in more detail in FIG. 10. HFSS simulations show that light is spectrum is selectively directed to the optimized detector via these intrawaveguide components. The components are fabricated as part of the plasma-enhanced chemical vapor deposition (PECVD) using standard CMOS manufacturing techniques of deposition and dry and wet etching.

Note that a multi-layer waveguide may preferably be used as was described in FIGS. 5A and 5B with a core 102 and multiple "cladding" layers 103. In this instance, the detectors are located below the waveguide, rather than within it, as was the case for the FIGS. 3A and 3B embodiments. Thus, comparing the positions of the layers 102, 103 and detectors 105 in the various arrangements depicted in FIGS. 1, 3A, 3B, 5A, 5B, 8A, 8B, and 9, to one another it should be understood that the drawings are not necessarily to scale for all aspects of all possible embodiments. The thickness of the various layers 102, 103 depicted for the waveguide and the detectors 105 may depend on the materials used and thus may be different than that suggested by looking at the drawings alone. For example, in one embodiment, the layers 103 may range from 100 nm to 1000 nm thick but the overall dimensions of the PVs 105 may be somewhat larger than any given layer 102, 103. Also, other materials may be used than suggested here for the layers 102, 103. In addition, the detectors 105 are not limited to band gap driven semiconductor photovoltaics, but can be any electron generating junction (e.g. tunnel junction). Furthermore, additional geometric and spectral separation can be achieved by lengthening the single layer waveguide 140 and optimizing the design of the dielectric filter 120. Thus it should be understood that the primary components of the design are the multi-layer wideband waveguide 102, 103, the adjacent detectors 105, and the optional features such as the dielectric filters 120, mirrors 130, and so forth.

10. MIM Rectennas

In another embodiment, one or more MIM rectennas 170 are placed vertically in series underneath the waveguide TIR mirror (as per FIG. 11) instead of photovoltaic detectors. Different layers 170-1, ..., 170-n of rectennas, tuned to a specific desired wavelength and bandwidth will be separated by some vertical distance. The spectral separation comes from the selectivity and sensitivity of each nantenna layer 170 to its corresponding wavelength. Existing antenna design principles allow the implementation of the tuned layers to be a straightforward procedure, allowing for any number of selective layers, depending on an efficiency/bandwidth trade.

Figure 12:
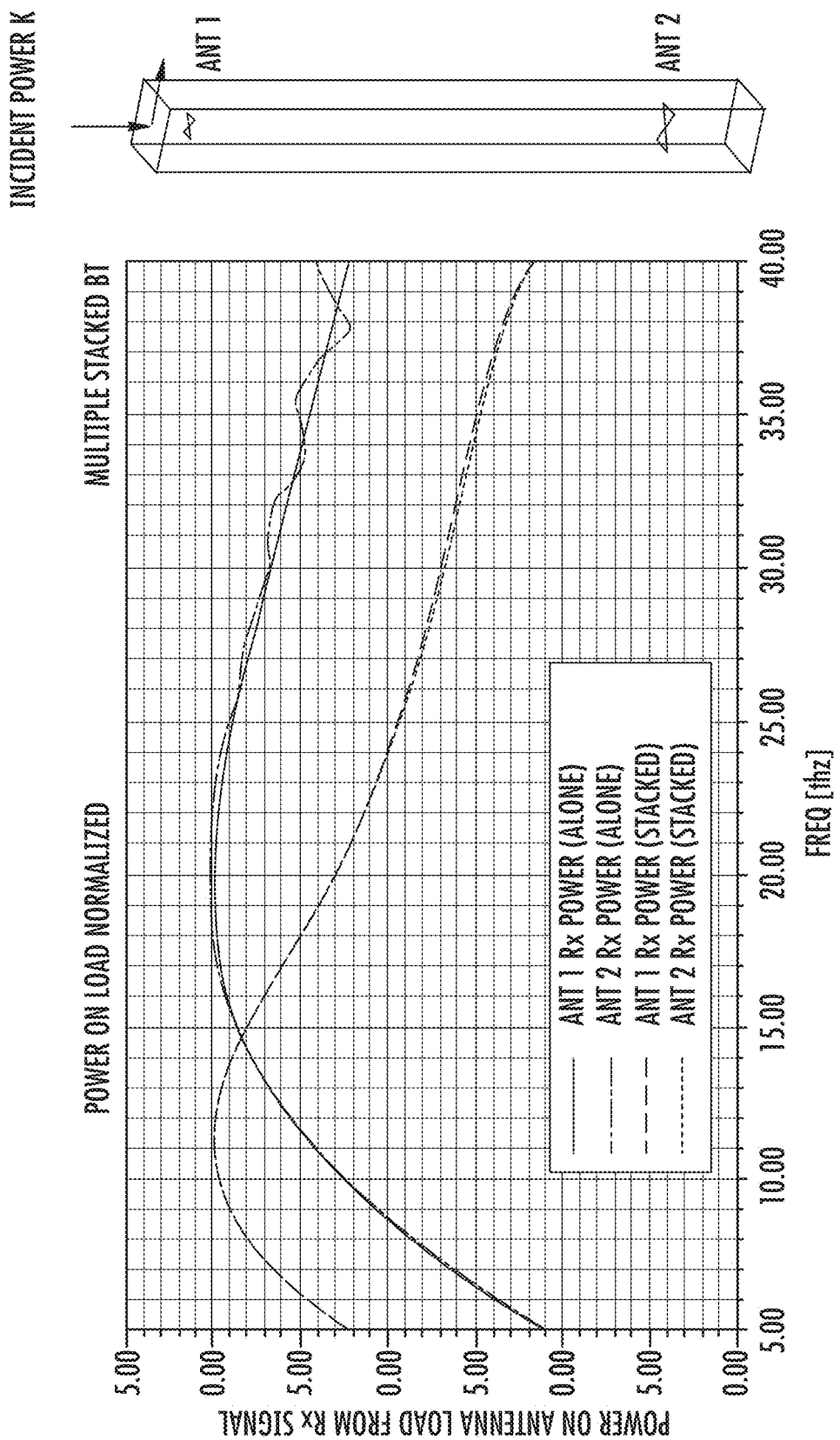
FIG. 12 is a result of simulating two stacked antennas.

It was shown in a full-wave FEM simulation (HFSS) that the stacking of different bands of antennas in a vertical arrangement causes little effect on the other band. In FIG. 12, two MIM "bowtie" antennas (antenna 1 and antenna 2 labeled "Ant1" and "Ant2" in the drawing) of two different bands (low and high) were stacked vertically. An incident wave entering from the top surface of the problem illuminates the system. Energy for which antenna 2 is tuned to are passed through antenna 1 and are collected on antenna 2 with little power loss or scattering. The traces in FIG. 12 clearly show the presence of a lower wavelength band nantenna above a higher wavelength band nantenna causes very little shadowing or scattering. This feature allows for spectral separation of tuned nantennae in a vertical arrangement for any number of layers of tuned antenna with a bandwidth appropriate for the layer arrangement. The concept is analogous to a log-periodic antenna.

Figure 13A:
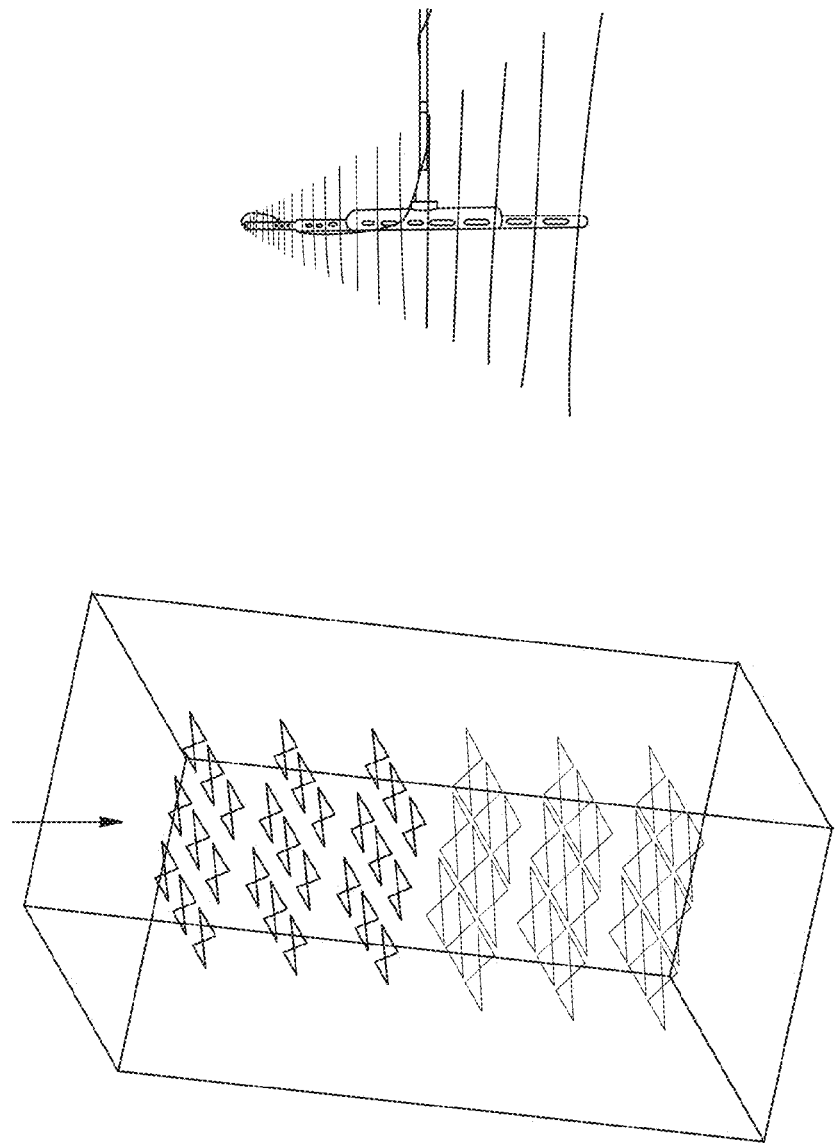
FIGS. 13A and 13B show a stacked bowtie array and the resulting power field.
Figure 13B:
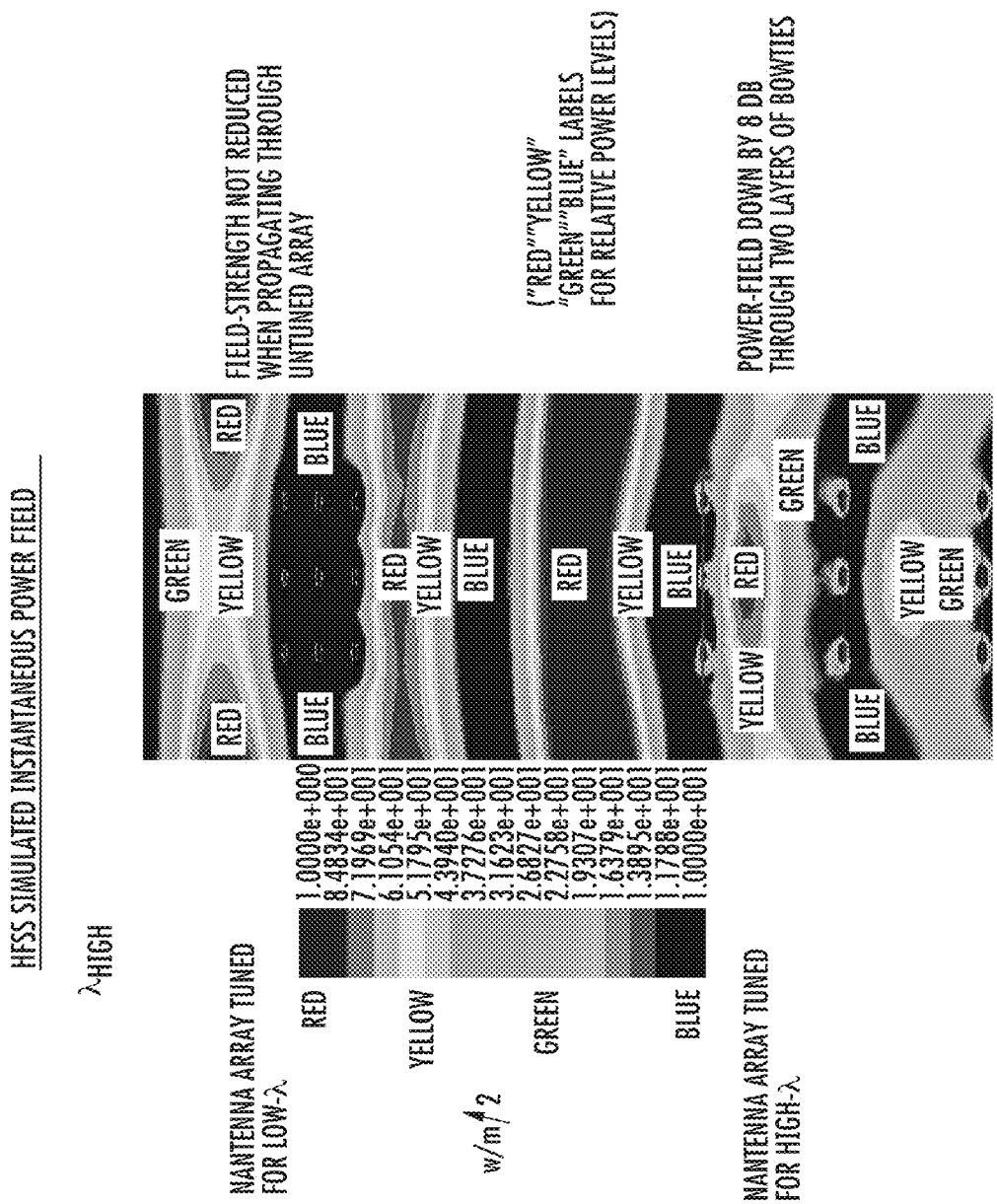

The MIM bowties could be arrayed periodically in x and y, and in z (separated by different layers or groups of layers corresponding to different frequency bands) as shown in FIG. 13A. Arrayed in this way, the bowties 170 can collect energy incident across a wide x-y plane, rather than having just a single nantenna at the center. For a given band, it will take more than a single layer of bowties 170 to collect 100% of the incident energy. Additional layers of the same band can be stacked before, after or interleaved with other band layers. Also in FIG. 13B, an HFSS power field cross section is shown, showing energy out of band for the first layer of bowties passing through undisturbed, and further being absorbed by the bowties in-band on lower layers.

Figure 14:
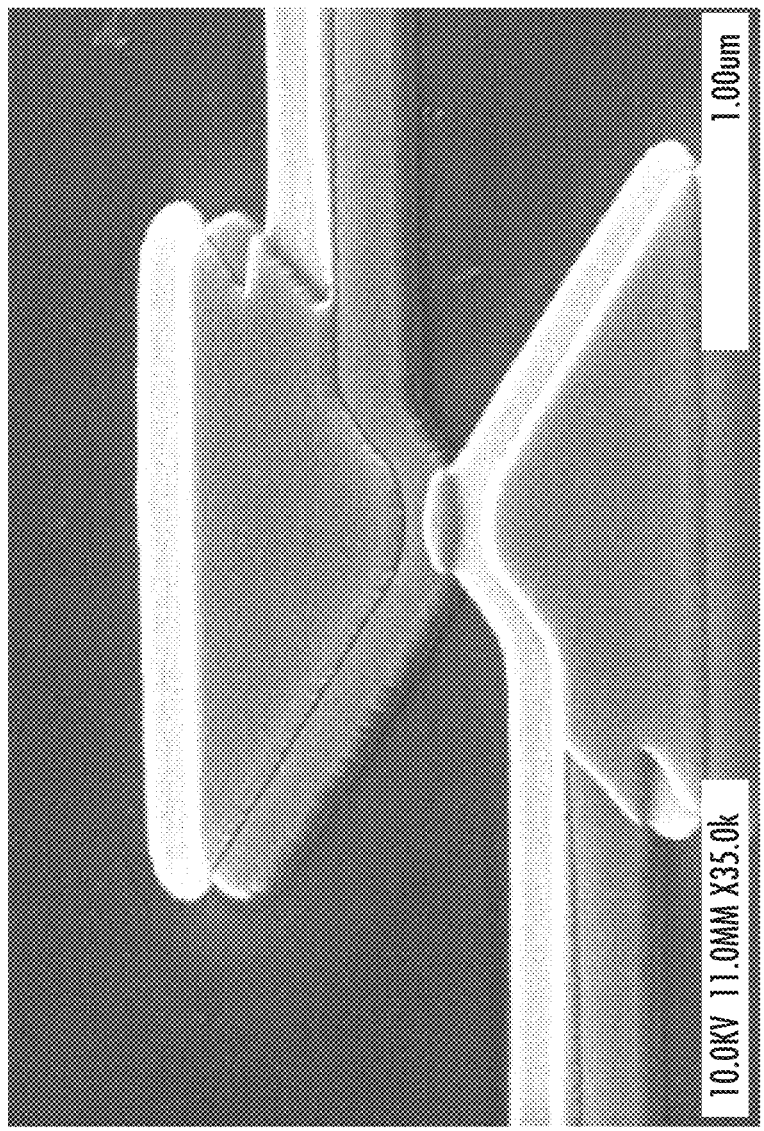
FIG. 14 shows a bowtie element in more detail.

FIG. 14 is a microphotograph of an integrated MIM bowtie antenna element.

Figure 15:
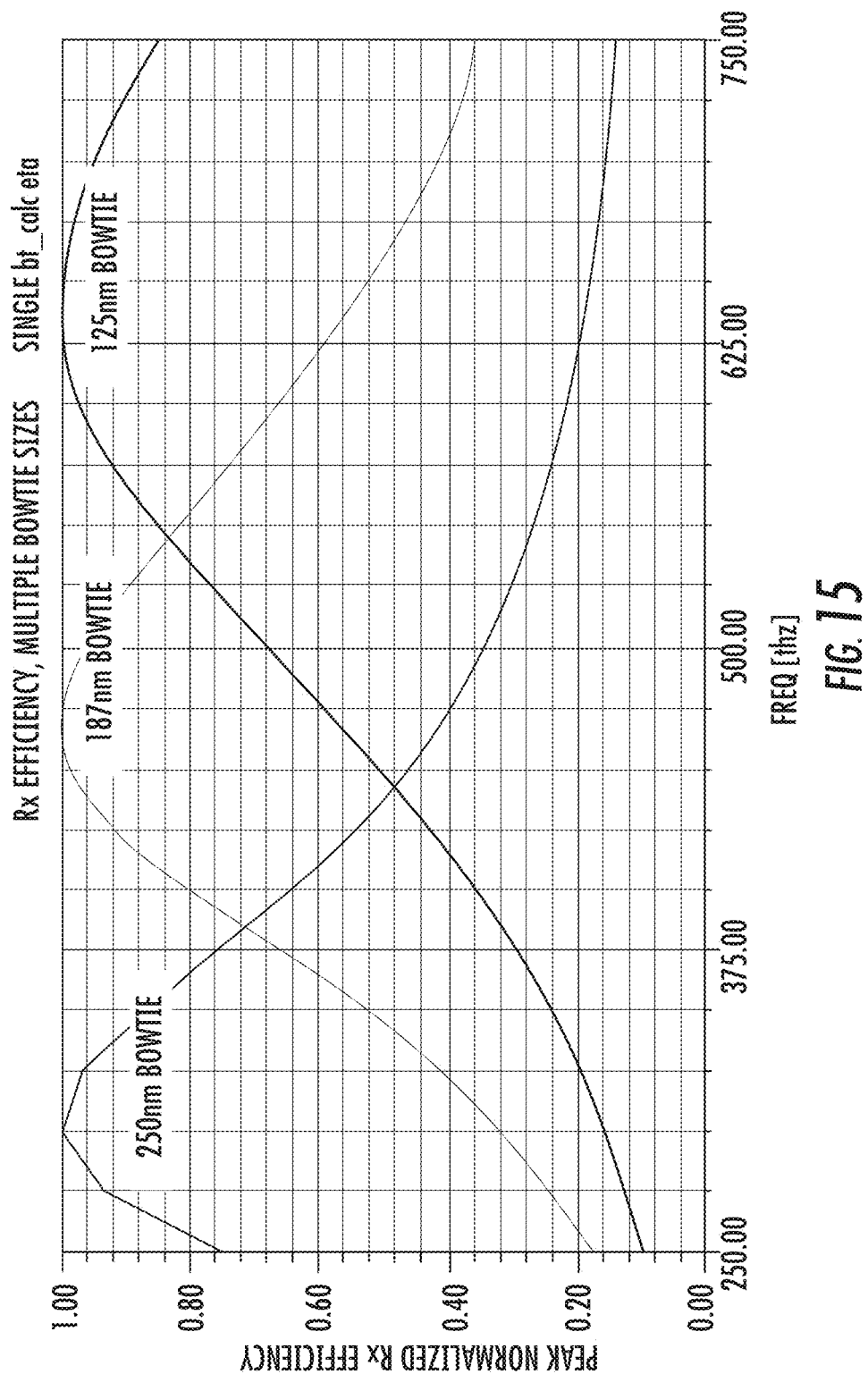
FIG. 15 is a plot of receive efficiency for different bow tie sizes.

FIG. 15 is a plot of expected receive efficiencies for bow tie elements of different sizes.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. An electromagnetic energy concentrator apparatus comprising:
    a prism having an entrance face and an exit face;
    a rectangular waveguide having a major axis and having a top planar surface and a bottom planar surface with the top planar surface aligned in parallel with the exit face of the prism, the waveguide including a waveguide core responsive to solar energy in a solar band, the waveguide core further guiding solar energy received from the prism in a direction along the major axis;
    a gap layer of uniform thickness disposed between the exit face of the prism and the top surface of waveguide and co-extensive with the exit face of the prism and the top surface of the waveguide;
    a plurality of solar energy detectors disposed adjacent to the waveguide and co-extensive with the bottom planar surface of the waveguide such that the detectors taken as a whole extend substantially along the same extent as the bottom surface of the waveguide, with at least two or more energy detectors operating in a first band, the first band being different from a second band in which at least two or more other energy detectors operate, the second band encompassing longer wavelengths than the first band, and the plurality of detectors thus collectively operating in each of at least two bands;
    one or more internal reflection mirrors disposed adjacent to or within the waveguide to further direct solar energy to the detectors;
    a plurality of intra-waveguide filter elements that each separate received light at a given position into two or more detectors;
    wherein a first distance between detectors operating in the first band depends on a wavelength in the first band;
    wherein a second distance between detectors operating in the second band depends on a wavelength in the second band, and wherein the second distance is longer than the first distance between detectors operating in the first band; and
    wherein the detectors include Metal Insulator Metal (MIM) rectennas disposed in a vertical series orientation perpendicular to the major axis of the waveguide and adjacent each mirror.

2. The apparatus of claim 1 wherein the detectors include a plurality of bowtie shaped elements arranged as an array in at least two dimensions.

3. The apparatus of claim 1 wherein the exit face of the prism and the top face of the waveguide have a length that includes multiple solar energy focusing regions.

4. An electromagnetic energy concentrator apparatus comprising:
    a prism having an entrance face and an exit face;
    a rectangular waveguide having a major axis and having a top planar surface and a bottom planar surface with the top planar surface aligned in parallel with the exit face of the prism, the waveguide including a waveguide core responsive to solar energy in a solar band, the waveguide core further guiding solar energy received from the prism in a direction along the major axis;
    a gap layer of uniform thickness disposed between the exit face of the prism and the top surface of waveguide and co-extensive with the exit face of the prism and the top surface of the waveguide;
    a plurality of solar energy detectors disposed adjacent to the waveguide and co-extensive with the bottom planar surface of the waveguide, such that the detectors taken as a whole extend substantially along the same extent as the bottom surface of the waveguide, with at least two or more energy detectors operating in a first band, the first band being different from a second band in which at least two or more other energy detectors operate, the second band encompassing longer wavelengths than the first band, and the plurality of detectors thus collectively operating in each of at least two bands;
    one or more internal reflection mirrors disposed adjacent to or within the waveguide to further direct solar energy to the detectors;
    wherein a first distance between detectors operating in the first band depends on a wavelength in the first band;
    wherein a second distance between detectors operating in the second band depends on a wavelength in the second band, and wherein the second distance is longer than the first distance between detectors operating in the first band; and
    wherein the waveguide further comprises a plurality of material layers, including at least a first waveguide layer and a second waveguide layer, and wherein the detectors operating in the first band are disposed in the first layer and wherein the detectors operating in the second band are disposed in the second layer.

5. The apparatus of claim 4 additionally comprising:
    a dichroic filter disposed adjacent the waveguide and the detectors.

6. The apparatus of claim 5 wherein the dichroic filter is formed from a multiple layer stack.

7. The apparatus of claim 4 wherein the detectors are Metal Insulator Metal (MIM) detectors.

8. The apparatus of claim 4 wherein the exit face of the prism and the top face of the waveguide have a length that includes multiple solar energy focusing regions.

\* \* \* \* \*